United States Patent
Lee et al.

(10) Patent No.: US 9,899,412 B2
(45) Date of Patent: *Feb. 20, 2018

(54) VERTICAL SEMICONDUCTOR DEVICE

(71) Applicant: Samsung Electronics Co., Ltd., Suwon-si (KR)

(72) Inventors: Jae-goo Lee, Suwon-si (KR); Young-woo Park, Seoul (KR); Jin-taek Park, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/464,983

(22) Filed: Mar. 21, 2017

(65) Prior Publication Data
US 2017/0194347 A1 Jul. 6, 2017

Related U.S. Application Data

(63) Continuation of application No. 14/267,909, filed on May 2, 2014, now Pat. No. 9,620,511.

(30) Foreign Application Priority Data

Jul. 8, 2013 (KR) .................. 10-2013-0079899

(51) Int. Cl.
H01L 29/66 (2006.01)
H01L 21/336 (2006.01)
H01L 27/11582 (2017.01)
H01L 27/11524 (2017.01)
H01L 27/11556 (2017.01)
H01L 27/1157 (2017.01)
H01L 23/522 (2006.01)

(52) U.S. Cl.
CPC .... H01L 27/11582 (2013.01); H01L 23/5226 (2013.01); H01L 27/1157 (2013.01); H01L 27/11524 (2013.01); H01L 27/11556 (2013.01)

(58) Field of Classification Search
CPC .................. H01L 27/11273; H01L 29/785
USPC ......... 438/268, 212, 173, 156; 257/135, 329
See application file for complete search history.

(56) References Cited

U.S. PATENT DOCUMENTS

| 8,008,722 B2 | 8/2011 | Kim et al. |
| 8,163,617 B2 | 4/2012 | Ahn |
| 8,237,218 B2 | 8/2012 | Murata et al. |
| 8,324,680 B2 | 12/2012 | Izumi et al. |

(Continued)

FOREIGN PATENT DOCUMENTS

| JP | 2011-066348 | 3/2011 |
| KR | 10-2011-0003041 A | 1/2011 |

*Primary Examiner* — Calvin Lee
(74) *Attorney, Agent, or Firm* — Muir Patent Law, PLLC

(57) ABSTRACT

A vertical semiconductor device includes a channel structure extending from a substrate in a first direction perpendicular to an upper surface of the substrate, and a ground selection line, word lines, and a string selection line sequentially formed on a side surface of the channel structure in the first direction to be separated from one another. The channel structure includes a protruding region formed in a side wall portion of the channel structure between the ground selection line and the upper surface of the substrate, the protruding region protruding in a horizontal direction perpendicular to the first direction.

14 Claims, 24 Drawing Sheets

(56) References Cited

U.S. PATENT DOCUMENTS

| | | |
|---|---|---|
| 8,981,458 B2 | 3/2015 | Lee et al. |
| 9,536,970 B2 | 1/2017 | Seol et al. |
| 9,620,511 B2 * | 4/2017 | Lee .................. H01L 27/11273 257/135 |
| 2011/0062510 A1 | 3/2011 | Joo |
| 2011/0233648 A1 | 9/2011 | Seol et al. |
| 2011/0303969 A1 | 12/2011 | Kai et al. |

* cited by examiner

THIRD DIRECTION
SECOND DIRECTION
FIRST DIRECTION

THIRD DIRECTION
SECOND DIRECTION
FIRST DIRECTION

THIRD DIRECTION

SECOND DIRECTION
FIRST DIRECTION

VERTICAL SEMICONDUCTOR DEVICE

CROSS-REFERENCE TO RELATED APPLICATIONS

This application is a continuation of U.S. patent application Ser. No. 14/267,909, filed May 2, 2014, in the U.S. Patent and Trademark Office, now U.S. Pat. No. 9,620,511, issued Apr. 11, 2017, which claims the benefit of Korean Patent Application No. 10-2013-0079899, filed on Jul. 8, 2013, in the Korean Intellectual Property Office, the disclosures of both of which are incorporated herein in their entireties by reference.

BACKGROUND

This disclosure relates to a vertical semiconductor device, and more particularly, to a vertical semiconductor memory device.

As a degree of integration of a memory device increases, a memory device having a vertical transistor structure has been suggested instead of a conventional memory device having a planar transistor structure. Conventional memory devices having vertical transistors include recesses formed in a substrate when a channel hole is formed. These recesses may affect the manufacturing process to cause an undesirable reduction of cell current in the memory device. It would thus be beneficial to improve this reduction of cell current.

SUMMARY

The various embodiments describe a vertical semiconductor device exhibiting improved electrical characteristics.

According to one embodiment, a vertical semiconductor device includes a channel structure extending from a substrate in a first direction perpendicular to an upper surface of the substrate, and a ground selection line, word lines, and a string selection line sequentially formed on a side surface of the channel structure in the first direction to be separated from one another. The channel structure includes a protruding region formed in a side wall portion of the channel structure between the ground selection line and the upper surface of the substrate, the protruding region protruding in a horizontal direction perpendicular to the first direction.

In one embodiment, a recess is not formed in a portion of the upper surface of the substrate that is vertically aligned with and facing a bottom surface of the channel structure.

A portion of the upper surface of the substrate vertically aligned with and facing a bottom surface of the channel structure may be flat.

A first width of the channel structure in the protruding region in a horizontal direction may be larger than a second width of the channel structure in the horizontal direction located on the same level as the ground selection line.

The vertical semiconductor device may further include a gate insulating layer provided between the channel structure and the ground selection line, in which the gate insulating layer extends along an outer wall of the channel structure so that a bottom surface of the gate insulating layer contacts the upper surface of the substrate.

The vertical semiconductor device may further include a first etch stop layer formed between the substrate and the ground selection line, in which the first etch stop layer is recessed in the horizontal direction to define an undercut region, and the protruding region of the channel structure is placed in the undercut region.

The vertical semiconductor device may further include a second etch stop layer formed between the ground selection line and the first etch stop layer.

The vertical semiconductor device may further include a gate insulating layer provided between the channel structure and the ground selection line, in which the gate insulating layer extends along an outer wall of the channel structure so that a bottom surface of the gate insulating layer contacts an upper surface of the second etch stop layer.

The ground selection line, the word lines, and the string selection line may include a metal silicide material.

The vertical semiconductor device may further include a source region extending in an upper portion of the substrate in a second direction parallel to a main surface of the substrate, and a common source line electrically connected to the source region, in which the source region does not comprise a metal silicide material.

According to another embodiment, a vertical semiconductor device includes a first etch stop layer formed on a substrate, a ground selection line, word lines, and a string selection line sequentially formed on the first etch stop layer to be separated from one another in a first direction perpendicular to an upper surface of the substrate, and a channel structure contacting the upper surface of the substrate by penetrating the first etch stop layer, the ground selection line, the word lines, and the string selection line, in which a portion of the channel structure penetrating the first etch stop layer protrudes in a horizontal direction.

The substrate may have an upper surface portion aligned with and facing the channel structure, and the upper surface portion may not be recessed.

The vertical semiconductor device may further include a gate insulating layer surrounding an outer wall of the channel structure, in which a bottom surface of the gate insulating layer is located on a level higher than an upper surface portion of the substrate, the upper surface portion being in contact with the channel structure.

The vertical semiconductor device may further include a second etch stop layer provided between the first etch stop layer and the ground selection line, in which the second etch stop layer comprises a material having an etch selectivity with respect to the first etch stop layer.

The channel structure may include a first channel layer extending in the first direction and contacting the upper surface of the substrate, and a second channel layer surrounding a side wall of the first channel layer, in which a bottom surface of the second channel layer is located on a level higher than a bottom surface of the first channel layer.

In certain embodiments, a vertical semiconductor device includes a substrate; a stack of layers including at least a first ground select line, a plurality of word lines, and at least a first string select line stacked alternately with insulating layers on the substrate; an additional insulating layer between the substrate and the stack of layers; a channel structure penetrating the additional insulating layer and the stack of layers and extending vertically in a first direction perpendicular to a top surface of the substrate; and a gate insulating layer surrounding outer walls of the channel structure. A bottom surface of the channel structure contacts the top surface of the substrate; and a first width of the channel structure in a horizontal direction at a level of the additional insulating layer is larger than a second width of the channel structure in the horizontal direction at the same level as the ground selection line.

In one embodiment, the channel structure and gate insulating layer form a protrusion in the additional insulating layer.

In one embodiment, a portion of the gate insulating layer contacts the top surface of the substrate.

In one embodiment, a height of the top surface of the substrate is the same at a location that contacts the bottom surface of the channel structure as at locations that do not contact bottom surfaces of channel structures.

In another embodiment, a source region extends in an upper portion of the substrate in a second direction parallel to the top surface of the substrate; and a common source line is electrically connected to the source region. Further, in this embodiment, the source region does not comprise a metal silicide material.

BRIEF DESCRIPTION OF THE DRAWINGS

Exemplary embodiments will be more clearly understood from the following detailed description taken in conjunction with the accompanying drawings in which.

DETAILED DESCRIPTION

Figure 1:
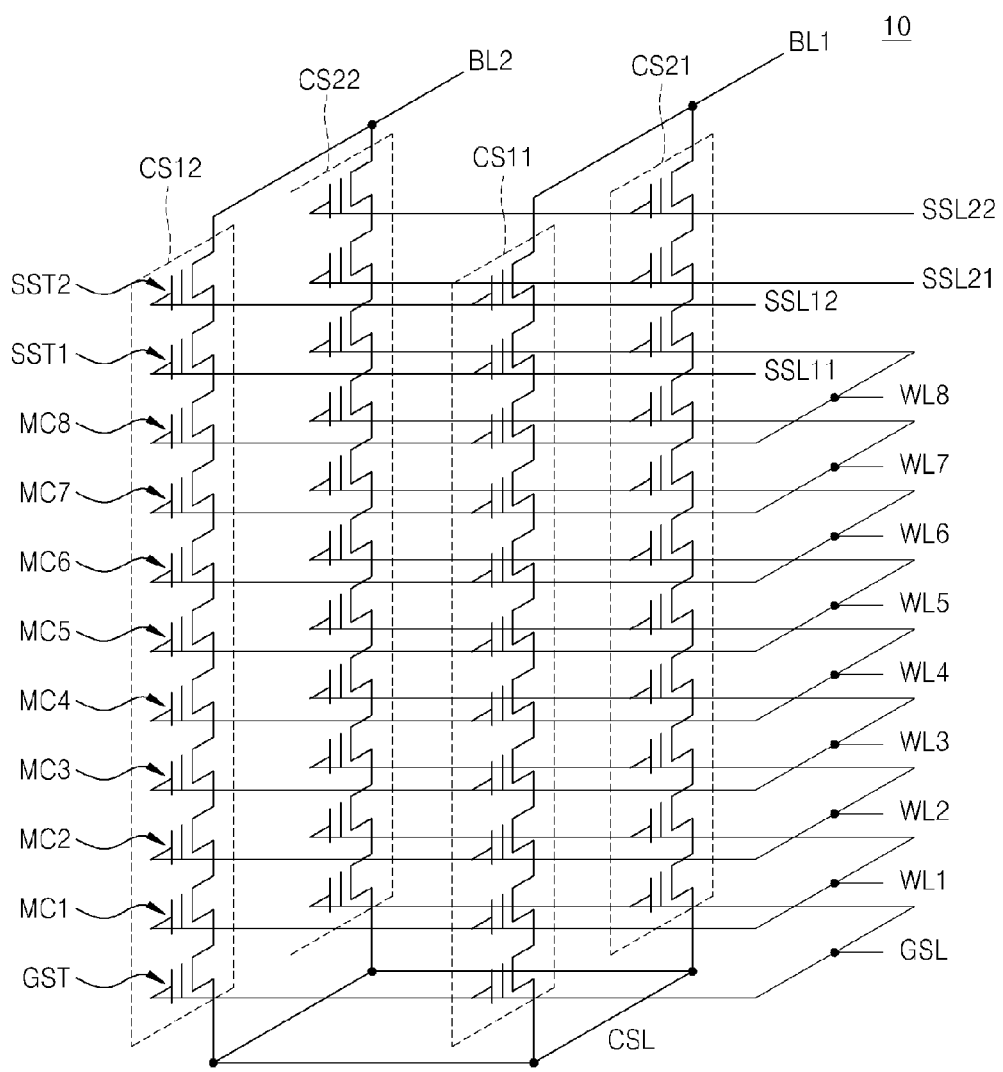
FIG. 1 is an exemplary circuit diagram of a memory cell array of a vertical semiconductor device according to one exemplary embodiment.

The present disclosure will now be described more fully with reference to the accompanying drawings, in which exemplary embodiments are shown. The inventive concept may, however, be embodied in many different forms and should not be construed as being limited to the embodiments set forth herein.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a first layer could be termed a second layer, and, similarly, a second layer could be termed a first layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and the specific properties and shapes do not limit aspects of the invention.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "flat," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

The term "contact," as used herein, implies a direct contact, unless indicated otherwise.

In the drawings, the thicknesses of layers and regions are exaggerated for clarity. Like numbers refer to like elements throughout.

FIG. 1 is an exemplary circuit diagram of a memory cell array 10 of a vertical semiconductor device according to one exemplary embodiment. FIG. 1 illustrates an exemplary circuit diagram of a vertical NAND flash memory device having a vertical channel structure.

The memory cell array 10 has a three-dimensional structure. The memory cell array 10 includes a plurality of cell strings CS11, CS12, CS21, and CS22 extending in a vertical direction. Each of the cell strings CS11, CS12, CS21, and CS22 may include a ground selection transistor GST, a plurality of memory cell transistors MC1, MC2, . . . , MC8, and a plurality of string selection transistors SST1 and SST2. Although FIG. 1 illustrates one ground selection transistor GST and two string selection transistors SST1 and SST2 which are connected to each of the cell strings CS11, CS12, CS21, and CS22, the numbers of the ground selection transistor and the string selection transistors are not limited thereto. Also, the number of the memory cell transistors MC1, MC2, . . . , MC8 is not limited thereto.

The cell strings CS11, CS12, CS21, and CS22 are connected in units of rows and columns. The string selection transistors SST1 and SST2 of each of the cell strings CS11, CS12, CS21, and CS22 are connected to bit lines BL1 and BL2 corresponding thereto. For example, the cell strings CS11 and CS21 commonly connected to the first bit line BL1 form a first column and the cell strings CS12 and CS22 commonly connected to the second bit line BL2 form a second column. Also, the string selection transistors SST1 and SST2 of each of the cell strings CS11, CS12, CS21, and CS22 are connected to string selection lines SSL11, SSL12, SSL21, and SSL22. For example, the cell strings CS11 and CS12 commonly connected to the first string selection lines SSL11 and SSL12 form a first row and the cell strings CS21 and CS22 commonly connected to the second string selection lines SSL21 and SSL22 form a second row.

The ground selection transistor GST of each of the cell strings CS11, CS12, CS21, and CS22 is connected to a ground selection line GSL. A common source line CSL is connected to the ground selection transistor GST of each of the cell strings CS11, CS12, CS21, and CS22.

The memory cell transistors MC1, MC2, . . . , MC8 located at the same height are connected to the same one of a plurality of word lines WL1, WL2, . . . , WL8. For example, the first memory cell transistor MC1 connected to the ground selection transistor GST may be connected to the first memory cell transistor MC1 in a neighboring row via the first word line WL1.

Figure 2A:
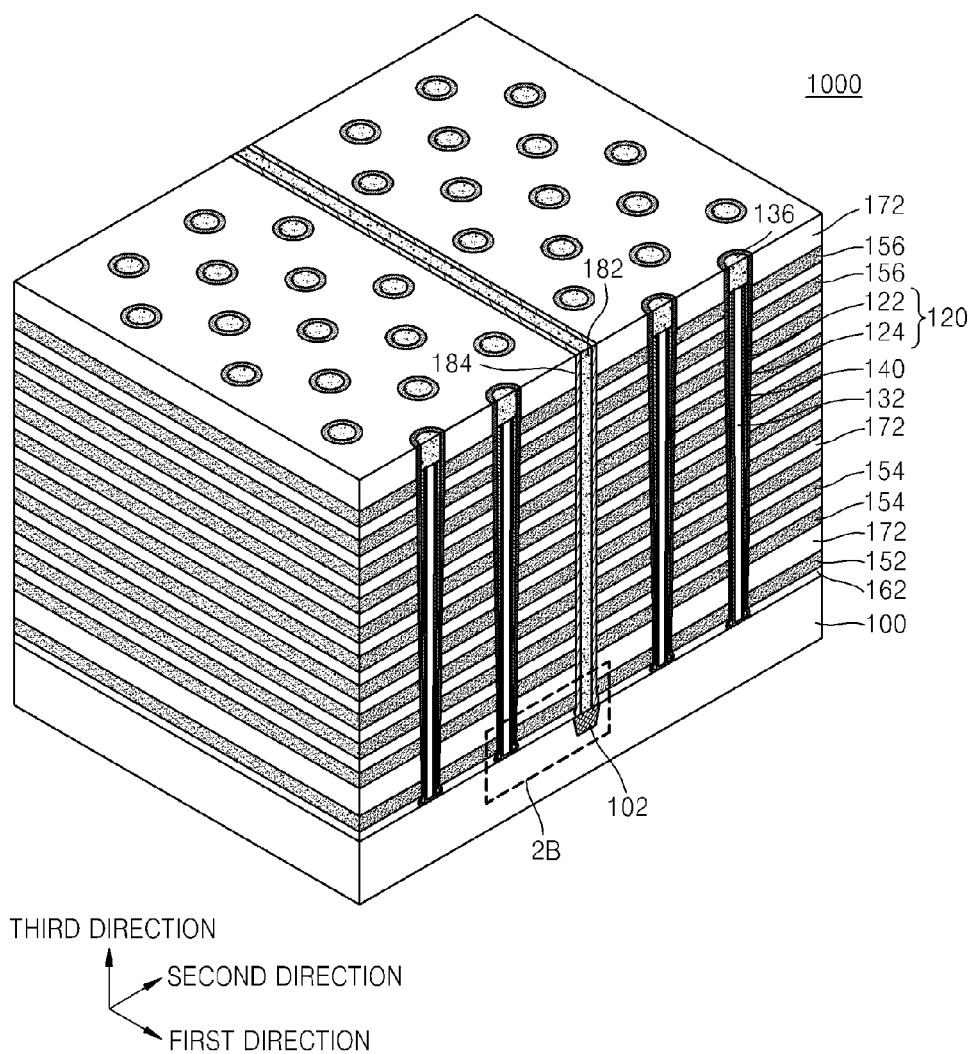
FIG. 2A is a perspective view illustrating a vertical semiconductor device according to one exemplary embodiment.
Figure 2B:
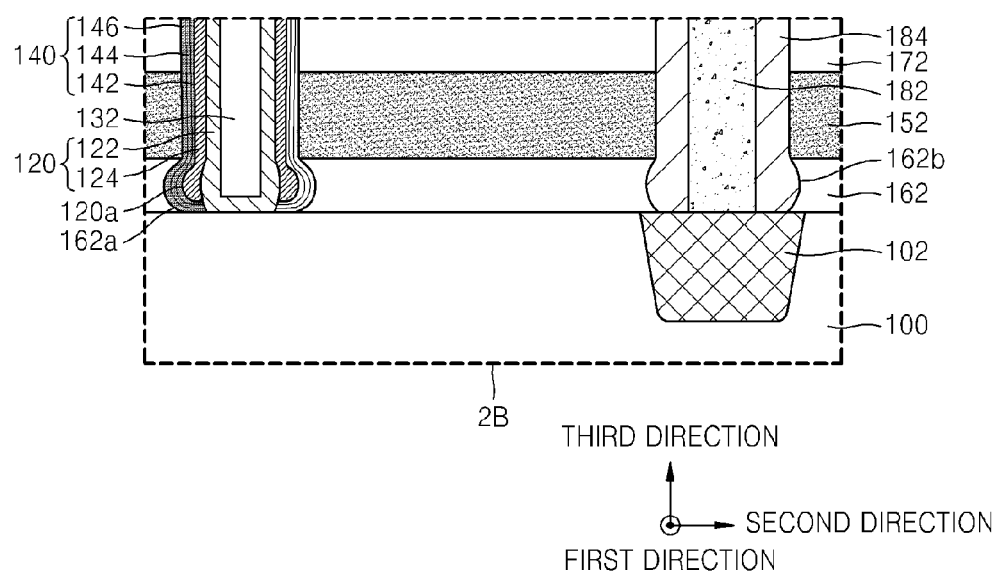
FIG. 2B is an enlarged cross-sectional view illustrating a portion 2B of FIG. 2A, according to one exemplary embodiment.

FIG. 2A is a perspective view illustrating a vertical semiconductor device 1000 according to an exemplary embodiment. FIG. 2B is an enlarged cross-sectional view illustrating a portion 2B of FIG. 2A, according to one exemplary embodiment. The vertical semiconductor device 1000 of FIG. 2A corresponds to the memory cell array of FIG. 1. For convenience of explanation, the bit lines Bl1 and BL2 of FIG. 1 are omitted in FIG. 2A.

Referring to FIGS. 2A and 2B, the vertical semiconductor device 1000 includes a substrate 100. The substrate 100 may include, for example, a silicon substrate, a germanium substrate, a silicon-germanium substrate, or a silicon-on-insulator (SOI) substrate. In exemplary embodiments, the substrate 100 may be a well of a first conductive type. For example, the substrate 100 may be a p-well that is formed by injecting a group III element such as boron (B). Also, the substrate 100 may be a pocket p-well provided in an n-well.

A source region 102 extending in a first direction parallel to a main surface of the substrate 100 is provided in an upper portion of the substrate 100. Although FIG. 1 illustrates only one source region 102, a plurality of source regions may be arranged extending in the first direction and separated in a second direction perpendicular to the first direction.

In exemplary embodiments, the source region 102 has a second conductive type that is different from that of the substrate 100. For example, the source region 102 may have an n conductive type. Also, in certain embodiments, the source region 102 does not include a metal silicide material. For example, in one embodiment, the source region 102 does not include a metal silicide material produced by an undesired reaction in the silicidation process of forming a ground selection line 152, a plurality of word lines 154, and a plurality of string selection lines 156.

A channel structure 120 extending in a third direction perpendicular to the first and second directions is arranged on the substrate 100 to be separated from the source region 102. A plurality of channel structures 120 may be provided and may be separated by a predetermined distance in the first and second directions. For example, the interval between the neighboring channel structures 120 in the first direction may be the same as the interval between the neighboring channel structures 120 in the second direction. Also, as illustrated in FIG. 2A, the interval between the neighboring channel structures 120 in the first direction may be different from the interval between the neighboring channel structures 120 in the second direction. Also, although FIG. 2A illustrates that the channel structures 120 are arranged in units of rows and columns in areas of the substrate 100 located at the opposite sides of the source region 102 extending in the first direction, a plurality of source regions 102 may be provided, and certain channel structures 120 may be arranged forming a single row extending in the first direction in an area between the neighboring source regions 102. The channel structures described herein may also be referred to as pillars.

The channel structure 120 may include a first channel layer 122 contacting an upper surface of the substrate 100 and a second channel layer 124 formed on a side wall of the first channel layer 122. In exemplary embodiments, a bottom surface of the first channel layer 122 contacts the upper surface of the substrate 100. Also, the first channel layer 122 may have a cup shape extending in the third direction, for example, a cylindrical shape with a closed bottom surface. Also, in one embodiment, the upper surface of the substrate 100 facing the first channel layer 122 is flat without being recessed. For example, an upper surface portion of the substrate 100 facing and aligned with the first channel layer 122 may be formed on substantially the same level as an upper surface portion of the substrate 100 that does not align with the first channel layer 122. Accordingly, the bottom surface of the first channel layer 122 may form a flat boundary surface with the upper surface of the substrate 100 and may be on substantially the same level as the upper surface of the substrate 100.

In exemplary embodiments, the second channel layer 124 has a cylindrical shape surrounding an outer wall of the first channel layer 122. A bottom surface of the second channel layer 124 may be formed at a level higher than the bottom surface of the first channel layer 122. Accordingly, in one embodiment, the bottom surface of the second channel layer 124 does not contact the upper surface of the substrate 100.

A protruding region 120a, also referred to herein as a bulge, may be formed in a lower portion of the channel structure 120. In one embodiment, an outer wall portion of the second channel layer 124 adjacent to the upper surface of the substrate 100 protrudes in a lateral direction so that the protruding region 120a of the channel structure 120 may be formed. The term "outer wall" may be used herein to refer to any portion of the external outer-facing surface of various elements whether it extends vertically or horizontally. In one embodiment, the width of the channel structure 120 in the protruding region 120a in a horizontal direction, for example, the first or second direction, is larger than the width of the channel structure 120 located on the same vertical level as the ground selection line 152, in the horizontal direction, such as the first or second direction.

In exemplary embodiments, the channel structure 120 includes silicon having a first conductive type, intrinsic silicon, or silicon having a second conductive type. The channel structure 120 may function as a channel region for each of the cell strings CS11, CS12, CS21, and CS22 of FIG. 1.

A gap-fill insulating layer 132 may be formed in the interior of the channel structure 120. In exemplary embodiments, the gap-fill insulating layer 132 includes an insulating material such as a silicon oxide, a silicon oxynitride, or a silicon nitride. Alternatively, the gap-fill insulating layer 132 may include an air-gap.

Also, a first conductive layer 136 may be formed on the channel structure 120 and the gap-fill insulating layer 132. The first conductive layer 136 may function as a drain region for each of the cell strings CS11, CS12, CS21, and CS22 of FIG. 1. The first conductive layer 136 may be polysilicon materials doped with a second conductive type. For example, the first conductive layer 136 may include n-type polysilicon including n-type impurities such as phosphorus (P) or arsenic (As).

In one embodiment, a gate insulating layer 140 is formed on the outer wall of the channel structure 120. For example, the gate insulating layer 140 may extend downwardly along the side wall of the channel structure 120, for example, including an outer wall of the second channel layer 124, and a bottom surface of the gate insulating layer 140 may contact the upper surface of the substrate 100. In one embodiment, the upper surface of the substrate 100 facing the gate insulating layer 140 has a flat shape without having a recess. The bottom surface of the gate insulating layer 140 may be located on substantially the same level as the bottom surface of the first channel layer 122.

In exemplary embodiments, the gate insulating layer 140 has a structure in which a tunnel insulating layer 142, a charge retaining layer 144, and a blocking insulating layer 146 are sequentially stacked. For example, the tunnel insulating layer 142 may include a silicon oxide. The charge retaining layer 144 may be a charge trap layer or a floating gate layer. The charge retaining layer 144 may include a silicon nitride or polysilicon. Also, the charge retaining layer 144 may include a quantum dot or nano crystal. In exemplary embodiments, the blocking insulating layer 146 includes a high-dielectric constant material. For example, the blocking insulating layer 146 may include a hafnium oxide, a zirconium oxide, an aluminum oxide, a tantalum oxide, an yttrium oxide, or combinations thereof. However, the materials of the blocking insulating layer 146 are not limited thereto. Furthermore, the blocking insulating layer 146 may be a structure in which two or more materials having different dielectric constants are stacked.

Although it is not illustrated in the drawings, a barrier material layer may be further formed on the blocking insulating layer 146. The barrier material layer has a function of preventing direct contacts between the ground selection line 152, the word lines 154, and/or the string selection lines 156. For example, the barrier material layer may include a titanium nitride, a tungsten nitride, or a tantalum nitride.

The ground selection line 152, the word lines 154, and the string selection lines 156 are formed on the side wall of the channel structure 120 to be separated from each other in the third direction. In the example shown in FIG. 2A, each of the ground selection line 152, the word lines 154, and the string selection lines 156 surround the side walls of the channel structures 120 arranged in rows and columns and extending in the first direction. The gate insulating layer 140 may be interposed between the channel structure 120 and the string selection lines 156, between the channel structure 120 and the word lines 154, and between the channel structure 120 and the ground selection line 152. Accordingly, the string selection lines 156, portions of the channel structure 120, and the gate insulating layer 140 adjacent to the string selection lines 156 altogether may form the string selection transistors SST1 and SST2. The word lines 154, portions of the channel structure 120, and the gate insulation layer 140 adjacent to the word lines 154 altogether may form the memory cell transistors MC1, MC2, . . . , MC8. The ground selection line 152, portions of the channel structure 120, and the gate insulating layer 140 adjacent to the ground selection line 152 altogether form the ground selection transistor GST.

In exemplary embodiments, the thicknesses of the ground selection line 152, the word lines 154, and the string selection lines 156 and the intervals between the ground selection line 152, the word lines 154, and the string selection lines 156 may be identical to each other or different from each other according to the required characteristics of the memory cell array 10. For example, FIG. 2A illustrates that the interval between the ground selection line 152 and the lowermost one of the word lines 154 is larger than the interval between the word lines 154 that neighbor each other. For example, to prevent cell interference between the ground selection line 152 and the word lines 154, the interval between the ground selection line 152 and the word lines 154 may be formed to be large. Also, to adjust a threshold voltage of the ground selection transistor GST and/or string selection transistors SST1 and SST2, the thicknesses of the ground selection line 152 and/or the string selection lines 156 may be variously formed.

In exemplary embodiments, the ground selection line 152, the word lines 154, and the string selection lines 156 may include a metal silicide material. For example, the ground selection line 152, the word lines 154, and the string selection lines 156 may include titanium silicide, tantalum silicide, tungsten silicide, cobalt silicide, or nickel silicide. The ground selection line 152, the word lines 154, and the string selection lines 156 may include the same material or different materials from each other.

In one embodiment, the ground selection line 152, the word lines 154, and the string selection lines 156 are not formed above the source region 102.

A first etch stop layer 162 may be formed between the ground selection line 152 and the substrate 100. In exemplary embodiments, a first undercut region 162a may be formed in the first etch stop layer 162 adjacent to the channel structure 120. For example, a side wall of the first etch stop layer 162 may be recessed in a lateral direction. The side wall may have a concave shape, such that a bottom portion is between the gate insulating layer 140 and the substrate in the third direction, and a top portion is between the gate insulating layer 140 and the ground select line in the third direction. A portion of the gate insulating layer 140 interposed between the first etch stop layer 162 and the channel structure 120 may be arranged in an area of the first undercut region 162a. Also, the protruding region 120a of the channel structure 120 may be located to be overlapped with the first undercut region 162a in the horizontal direction.

In exemplary embodiments, the first etch stop layer 162 includes an insulating material such as a silicon oxide, a silicon nitride, or a silicon oxynitride. However, the material of the first etch stop layer 162 is not limited thereto and the first etch stop layer 162 may include any material having an etching selectivity with respect to a sacrificial layer (not shown) for forming the ground selection line 152 and/or the substrate 100. For example, when the sacrificial layer for forming the ground selection line 152 includes polysilicon, the first etch stop layer 162 may include a silicon oxide.

For example, in one embodiment, when a portion of the first etch stop layer 162 is removed by using an etching process using an etching selectivity between the sacrificial layer for forming the ground selection line 152 and the first etch stop layer 162, the upper surface of the substrate 100 is not recessed and an undercut may be generated in a portion of the first etch stop layer 162 due to an isotropic etching characteristic of the etching process. Accordingly, a portion of the upper surface of the substrate 100 that is not covered by the first etch stop layer 162 may be formed to be flat and the bottom surface of the first channel layer 122 facing the portion of the upper surface of the substrate 100 may be formed to be flat. Also, since a contact area between the gate insulating layer 140 and the substrate 100 may be increased by the protruding region 120*a* of the first channel layer 122, a contact resistance between the channel structure 120 and the substrate 100 may be reduced.

A plurality of first insulating layers 172 may be interposed between the ground selection line 152 and the lowermost one of the word lines 154, between the neighboring word lines 154, and between the uppermost one of the word lines 154 and the string selection lines 156. The first insulating layers 172 may include an insulating material such as a silicon oxide, a silicon oxynitride, or a silicon nitride. The first insulating layers 172 may electrically insulate between the ground selection line 152, the word lines 154, and the string selection lines 156.

A common source line 182 may extend in the first direction on the source region 102. For example, the common source line 182 may be formed of a conductive material such as metal including tungsten (W), aluminum (Al), copper (Cu), titanium (Ti), or tantalum (Ta), polysilicon doped with impurities, or metal silicide including nickel silicide, titanium silicide, tungsten silicide, or cobalt silicide. A spacer 184 including an insulating material is formed on opposite side walls of the common source line 182 so as to electrically insulate the common source line 182 from the ground selection line 152, the word lines 154, and the string selection lines 156.

A second undercut region 162*b* may be defined in a portion of the first etch stop layer 162 adjacent to the source region 102. Accordingly, a portion of the spacer 184 contacting the first etch stop layer 162 may be located in the second undercut region 162*b*. Stated differently, the spacer 184, at a location having the same height as the first etch stop layer 162 may have a bulge shape on outer side walls to form a convex shape, and a side wall of the first etch stop layer 162 at that location may have a concave shape. The portion of the upper surface of the substrate where the source region 102 is formed may be formed to be flat without being recessed.

Figure 5A:
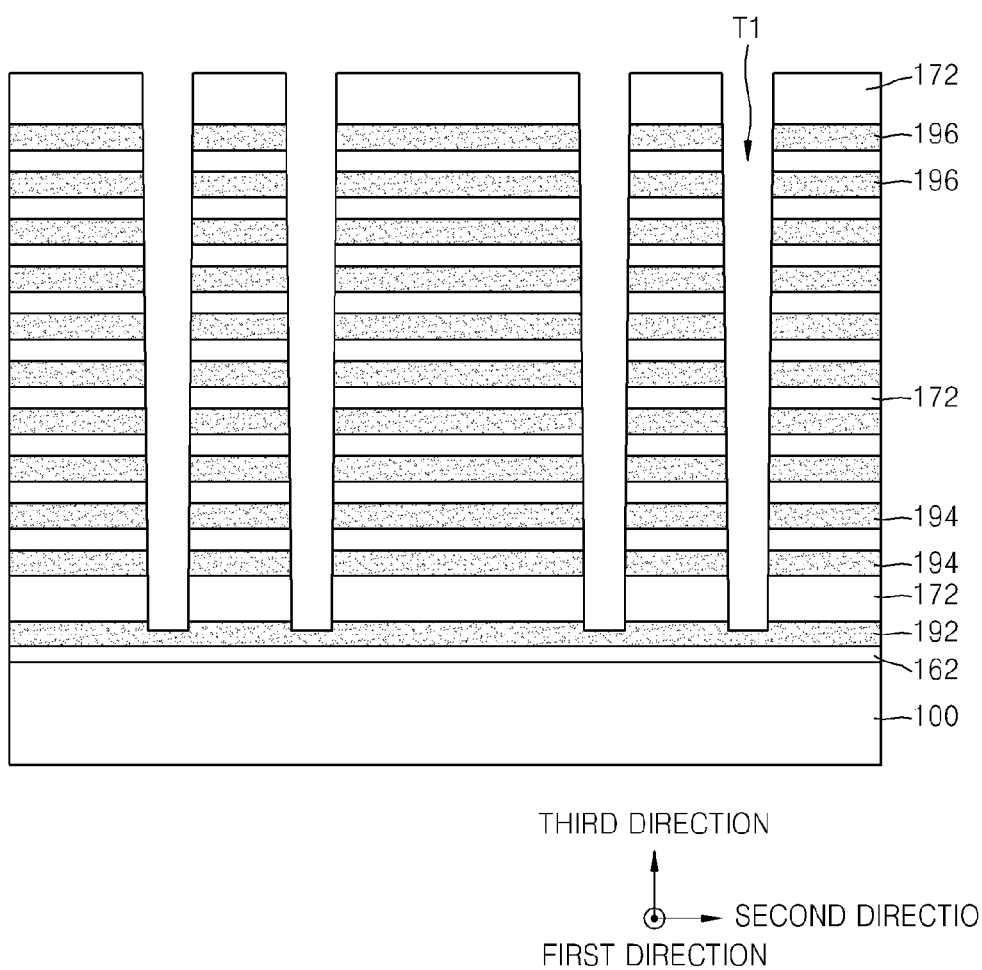
FIGS. 5A through 5J are cross-sectional views illustrating a method of manufacturing a vertical semiconductor device according to one exemplary embodiment.
Figure 5B:
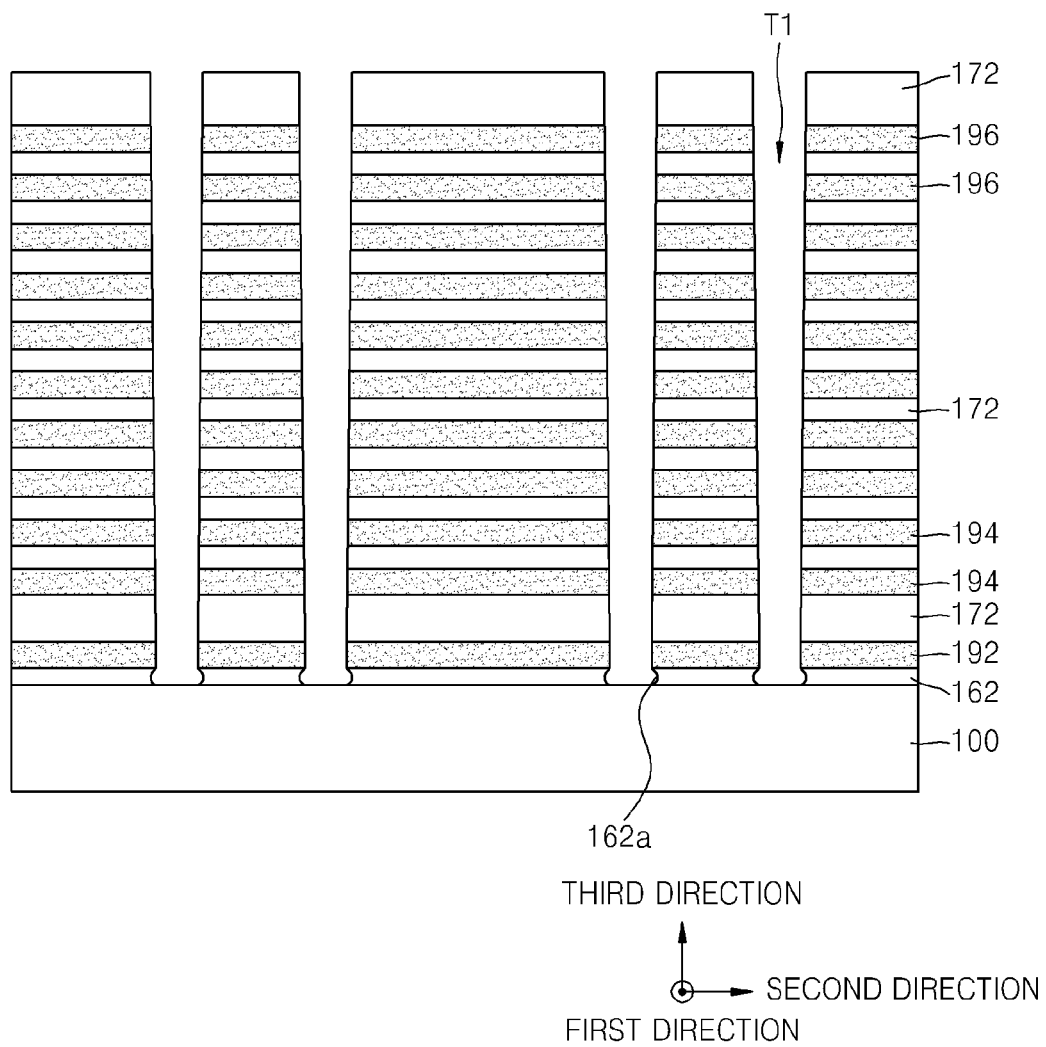
Figure 5C:
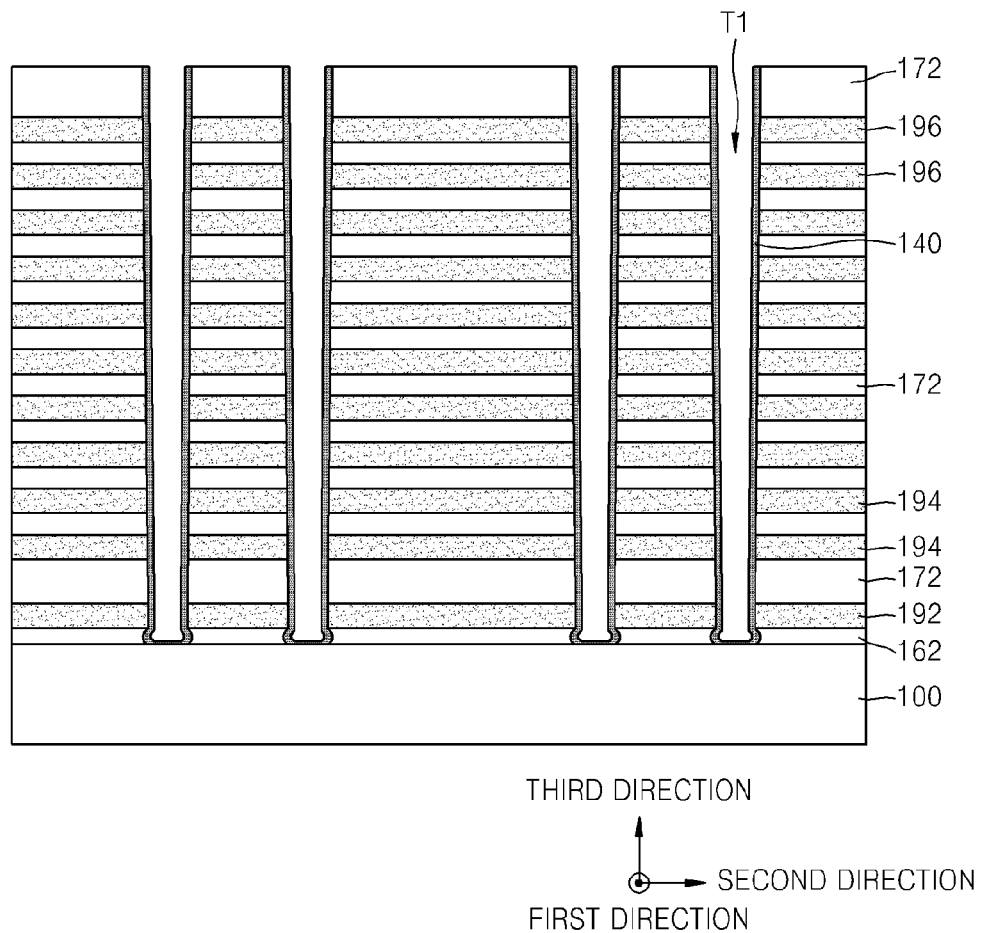
Figure 5D:
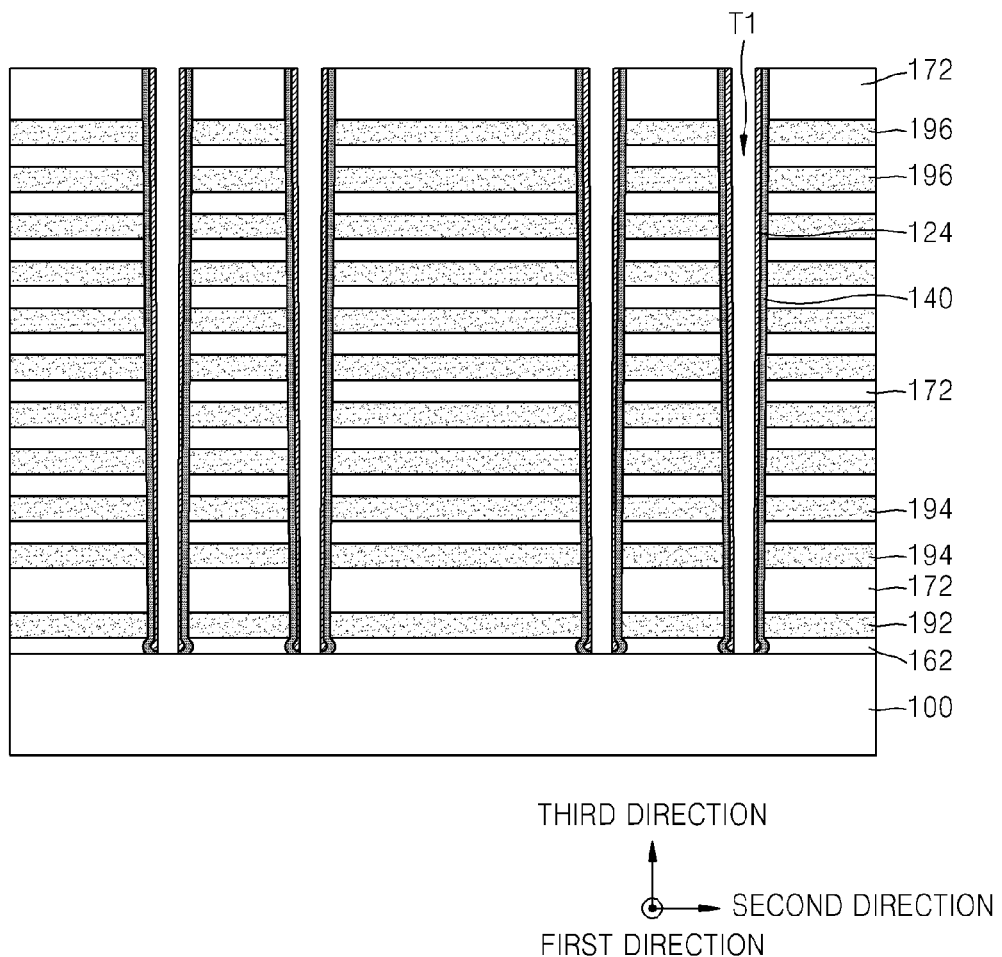
Figure 5E:
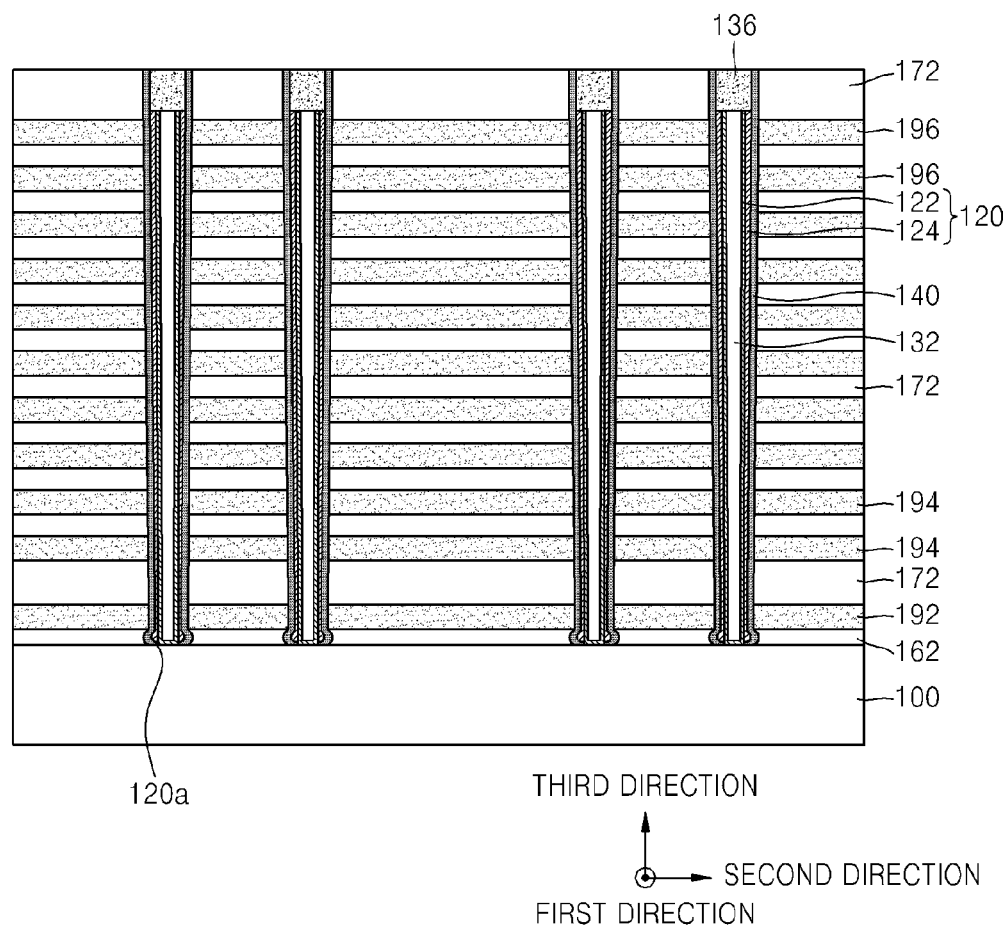
Figure 5F:
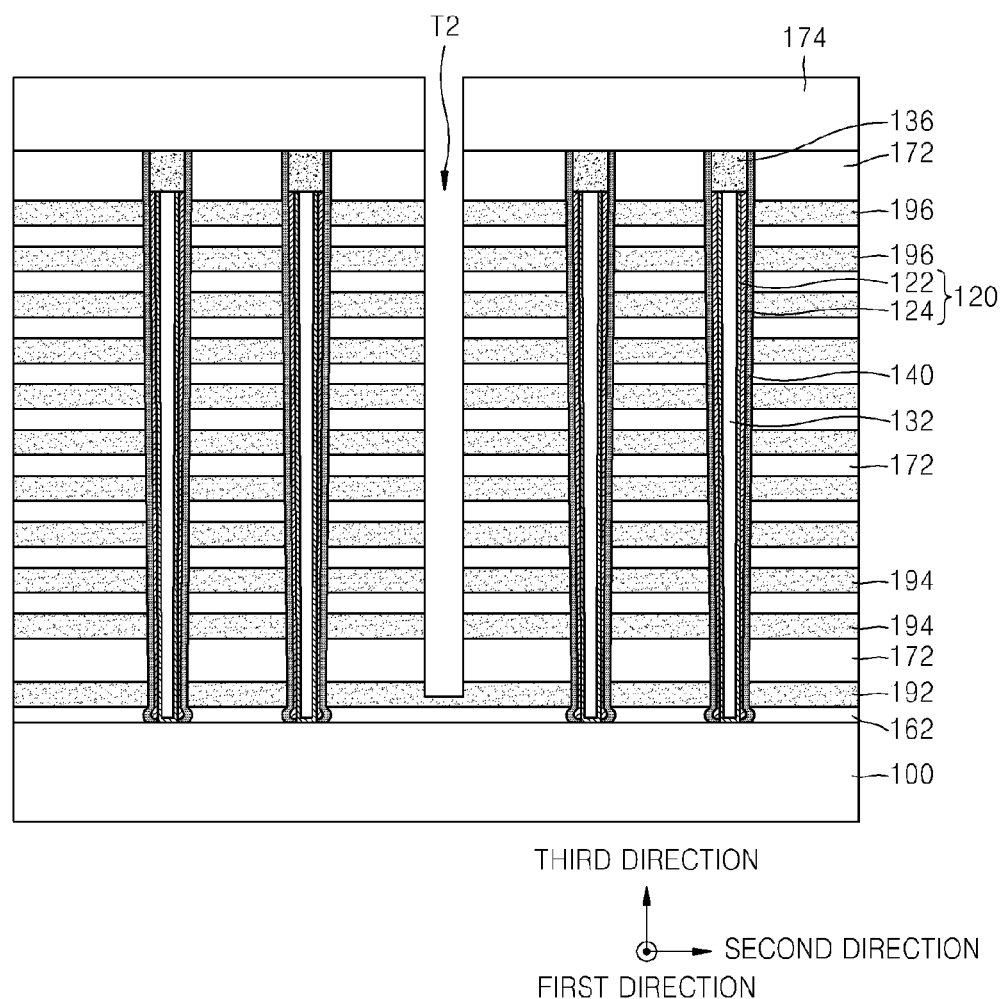
Figure 5G:
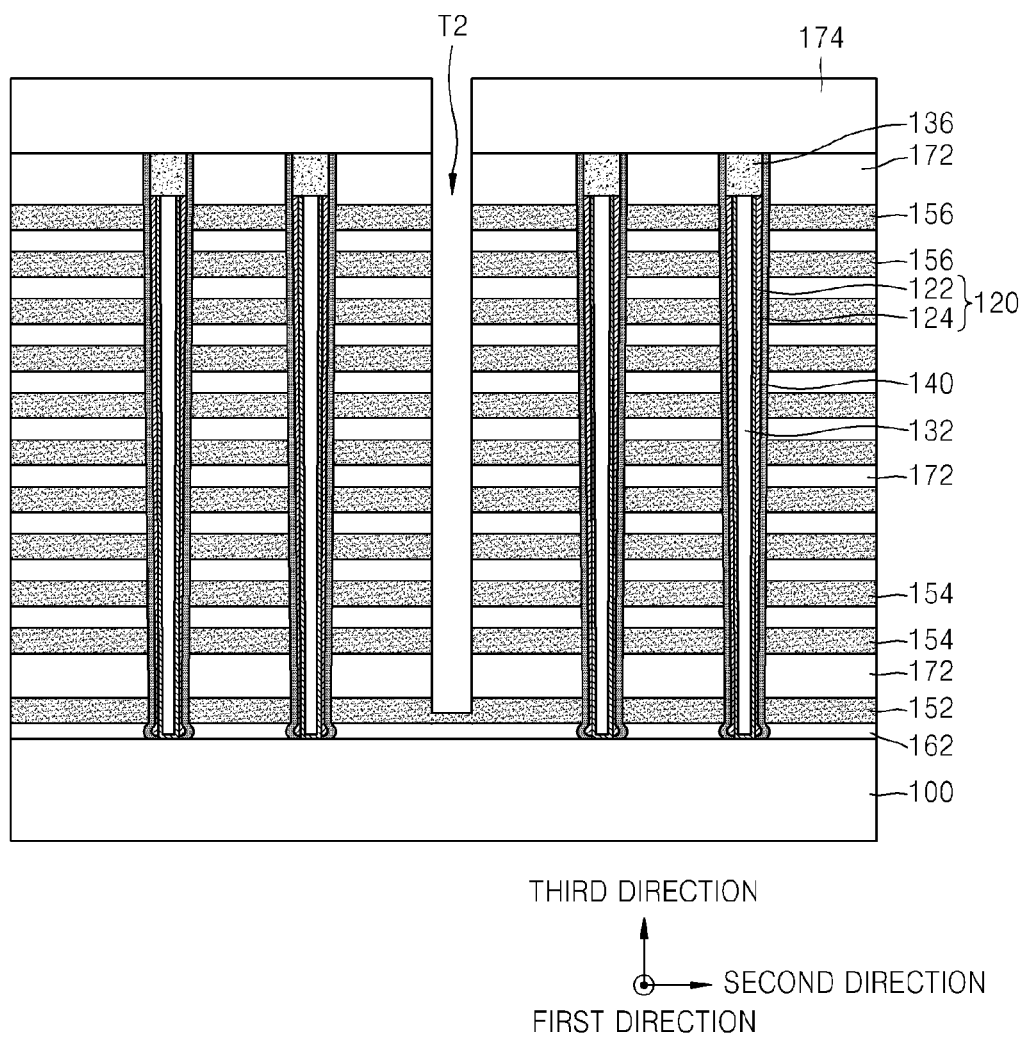
Figure 5H:
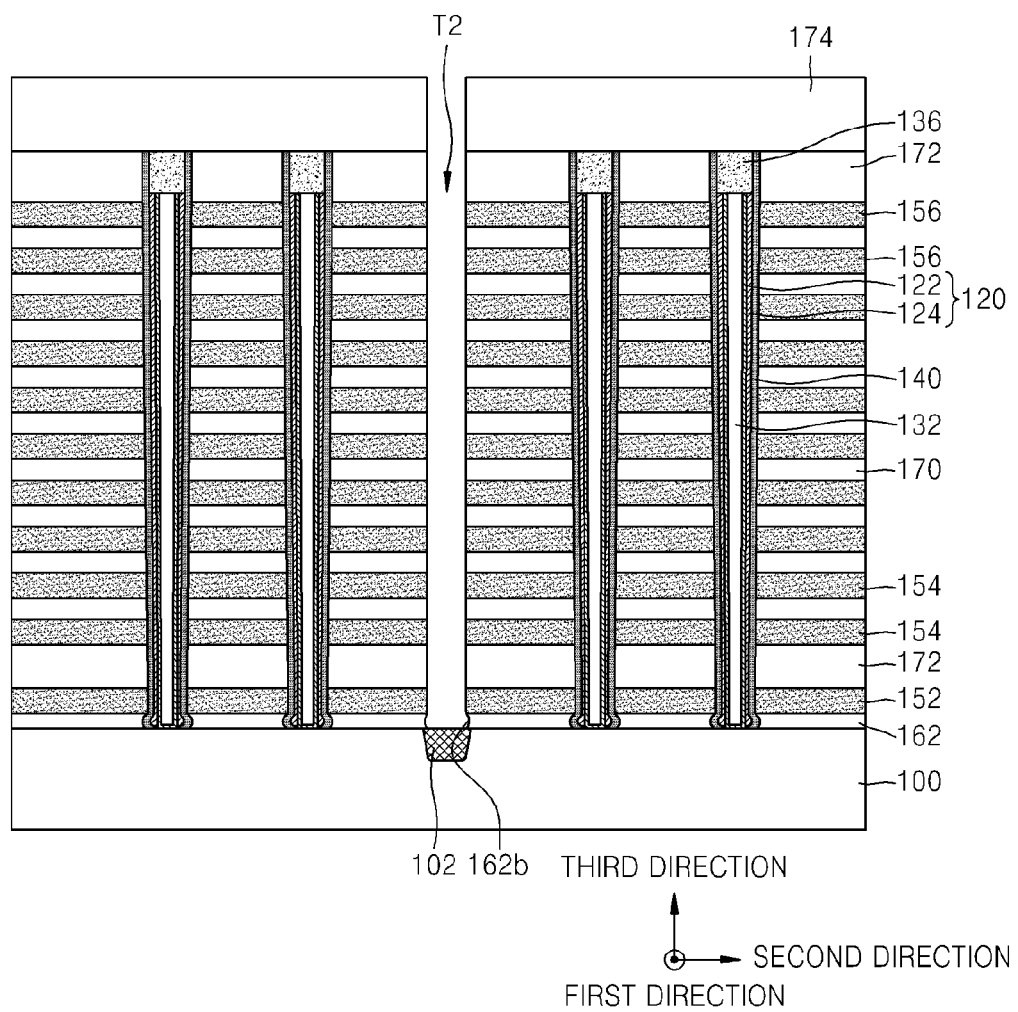
Figure 5I:
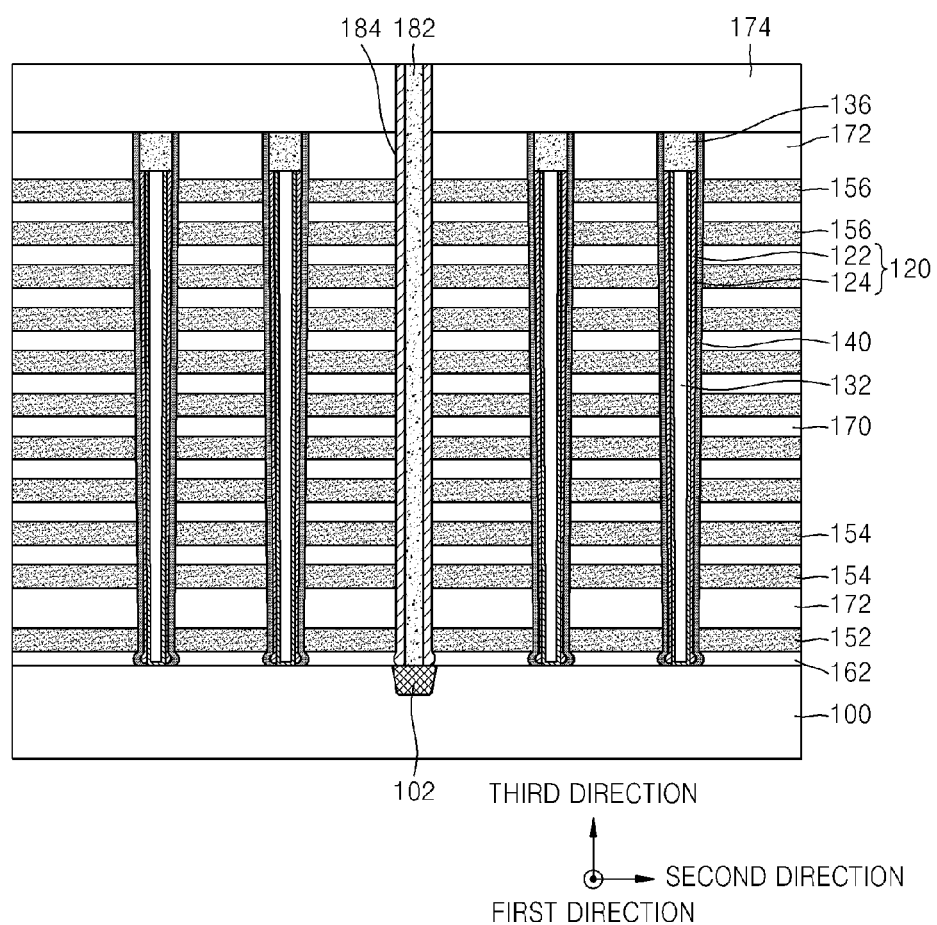
Figure 5J:
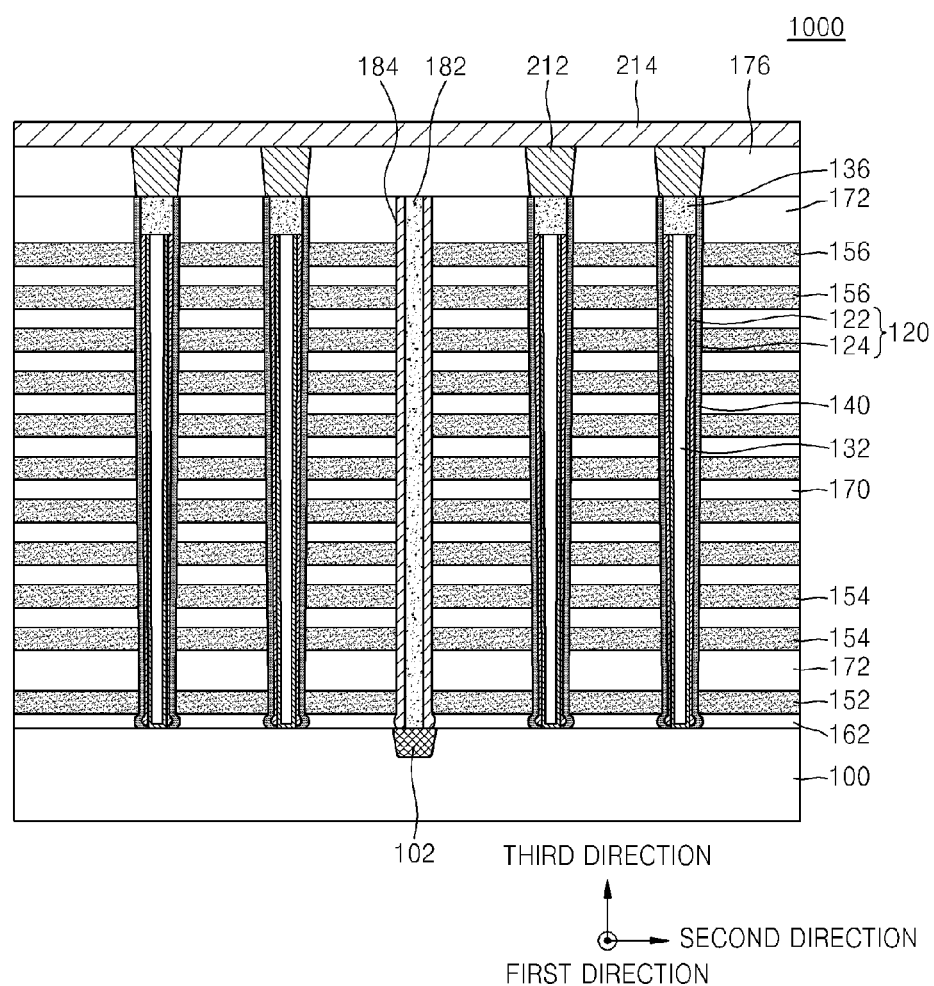

Although it is omitted in FIG. 2A for convenience of explanation, a bit line contact, such as 212 of FIG. 5J, may be further formed on the channel structure 120 and the first conductive layer 136 and a bit line, such as 214 of FIG. 5J extending in the second direction may be further formed on the bit line contact 212.

The structure of the memory cell array 10 of FIGS. 1 and 2A is exemplary and the number of the word lines 154, the number of the string selection lines 156, and the number of the ground selection line 152 are not limited to the exemplary embodiments shown. For example, the string selection line 156 may be provided in the number of two or more sequentially in the third direction, or the ground selection line 152 may be provided in the number of two or more sequentially in the third direction. Also, the number of the word lines 154 may be various, for example, 16, 32, or 64. The number of the cell strings connected to the bit line 214 may also not be limited to the above-describe number of cell strings CS11, CS12, CS21, and CS22 in FIGS. 1 and 2A. The cell strings may be provided in a variety of numbers according to the design of the memory cell array 10. Also, the structure of the memory cell array 10 of FIGS. 1 and 2A is exemplary and the memory cell array 10 is not limited to the embodiments described herein and may include a variety of types of memory cell arrays formed in a three-dimensional array structure.

According to one embodiment, the first etch stop layer 162 may include a material having an etching selectivity with respect to the sacrificial layer for forming the ground selection line 152 and/or the substrate 100. Accordingly, formation of a recess in the upper portion of the substrate 100 in an etching process of a contact hole (not shown) for forming the channel structure 120 may be prevented. When the recess is formed in the upper portion of the substrate 100, the gate insulating layer 140 extends to the interior of the recess and thus a cell current from the substrate 100 to the channel structure 120 may be reduced. Also, a deviation in the cell current from the substrate 100 to the channel structure 120 may be generated according to a deviation in the depth of the recess. According to the above and other embodiments, since the upper surface of the substrate 100 is not recessed, the cell current decrease may be prevented and the deviation in the cell current may be effectively reduced. Also, the first undercut region 162*a* may be formed in the lower portion of the contact hole in the etching process. As the protruding region 120*a* of the channel structure 120 is defined in the interior of the first undercut region 162*a*, a contact resistance between the substrate 100 and the channel structure 120 may be reduced. Accordingly, the vertical semiconductor device 1000 according to the exemplary embodiments may exhibit improved electrical characteristics.

Figure 3A:
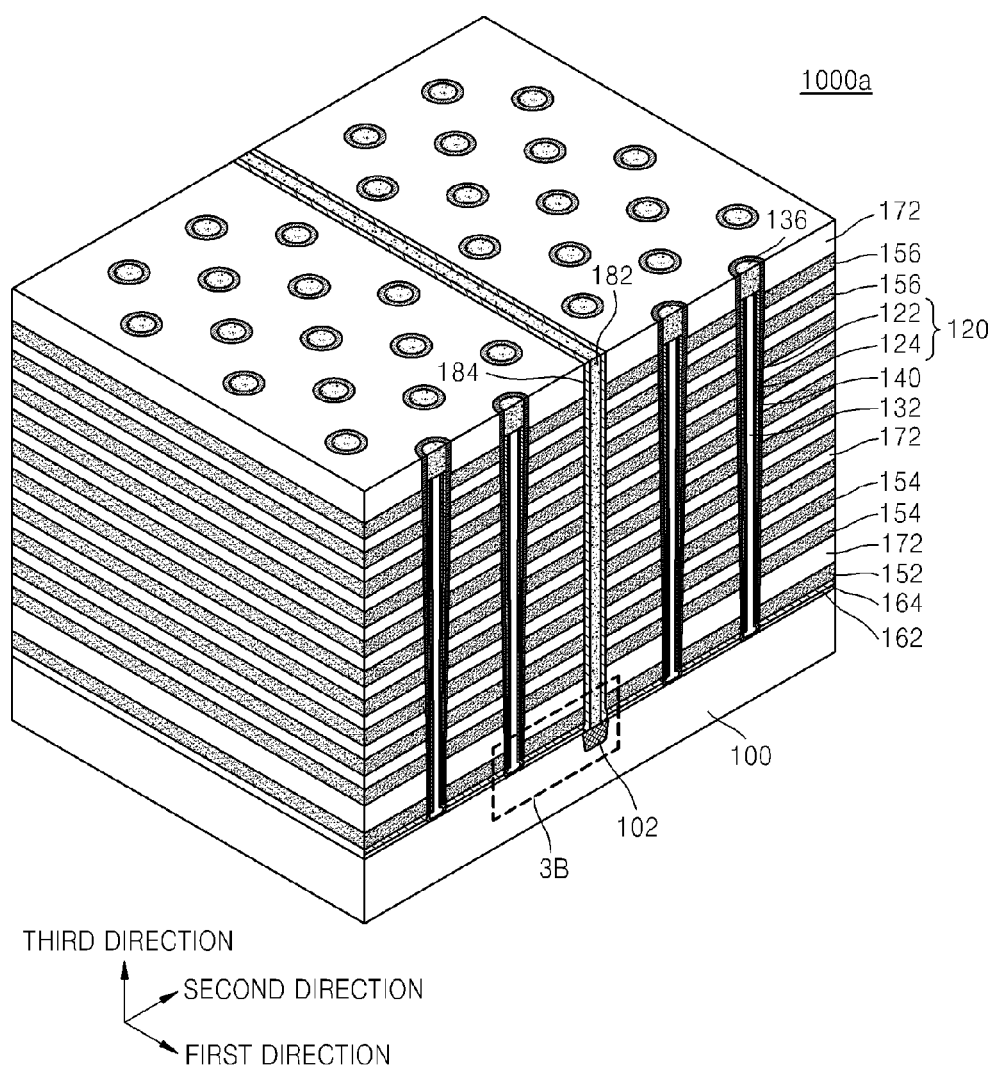
FIG. 3A is a perspective view illustrating a vertical semiconductor device according to another exemplary embodiment.
Figure 3B:
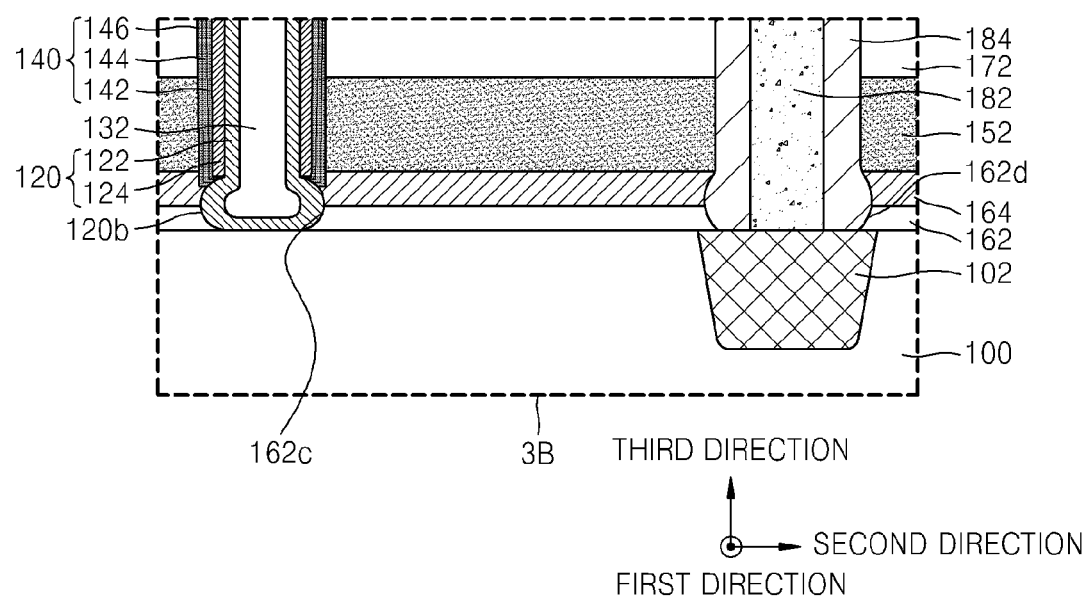
FIG. 3B is an enlarged cross-sectional view illustrating a portion 3B of FIG. 3A, according to one exemplary embodiment.

FIG. 3A is a perspective view illustrating a vertical semiconductor device 1000*a* according to another exemplary embodiment. FIG. 3B is an enlarged cross-sectional view illustrating a portion 3B of FIG. 3A, according to one exemplary embodiment. Since the vertical semiconductor device 1000*a* of FIGS. 3A and 3B is similar to the vertical semiconductor device 1000 described with reference to FIGS. 2A and 2B, except for certain features such as a second etch stop layer 164 being further formed, and a different shape of channel structure 120 and gate insulating layer 140, the following description will mainly discuss the above-described differences.

Referring to FIGS. 3A and 3B, the first etch stop layer 162 and the second etch stop layer 164 may be sequentially formed between the substrate 100 and the ground selection line 152. The second etch stop layer 164 may be formed to cover the upper portion of the first etch stop layer 162 with a predetermined thickness. In exemplary embodiments, the second etch stop layer 164 includes an insulating material having an etching selectivity with respect to a sacrificial layer (not shown) for forming the ground selection line 152 and/or the first etch stop layer 162. For example, the second etch stop layer 164 may be a silicon oxide, a silicon nitride, a silicon oxynitride, a silicon carbide, or a metal oxide such as a hafnium oxide, an aluminum oxide, a zirconium oxide, a boron oxide, or a tantalum oxide. In an exemplary case, when the sacrificial layer for the ground selection line 152 includes polysilicon and the first etch stop layer 162 includes a silicon oxide, the second etch stop layer 164 may include an aluminum oxide ($AlO_x$).

The first etch stop layer 162 may be formed to cover the upper surfaces of the substrate at opposite sides of the source region 102. In the exemplary embodiments, the first etch stop layer 162 includes a material having an etching selectivity with respect to a sacrificial layer (not shown) for forming the ground selection line 152 and/or the substrate 100. A first undercut region 162c may be formed in portions of the first and second etch stop layers 162 and 164 adjacent to the channel structure 120. As such, the side wall of the first etch stop layer 162 is recessed in a lateral direction so that the first undercut region 162c may be formed.

The channel structure 120 may include the first channel layer 122 contacting the upper surface of the substrate 100 and the second channel layer 124 formed on the side wall of the first channel layer 122. In exemplary embodiments, the bottom surface of the first channel layer 122 contacts the upper surface of the substrate 100 and extends in the third direction perpendicular to the main surface of the substrate 100.

The second channel layer 124 may have a cylindrical shape surrounding part of the outer wall of the first channel layer 122. A bottom surface of the second channel layer 124 may be formed at a level higher than the bottom surface of the first channel layer 122. Accordingly, in one embodiment, the bottom surface of the second channel layer 124 does not contact the upper surface of the substrate 100.

A protruding region 120b protruding in the lateral direction may be formed in the bottom portion of the channel structure 120. The protruding region 120b may be described to be a side wall portion of the first channel layer 122 that is overlapped with the first and second etch stop layers 162 and 164 in the horizontal direction. The outer wall of bottom portion of the channel structure 120 may be described as convexly shaped, and the etch stop layers 162 and 164 may be described together as an etch stop layer that is concavely shaped and in contact with the first channel layer 122. The width of the first channel layer 122 in the horizontal direction in the protruding region 120b may be larger than the width of the first channel layer 122 in the horizontal direction located on the same level as the ground selection line 152.

For example, in one embodiment, when the portion of the second etch stop layer 164 is removed by using an etching process using an etching selectivity between the sacrificial layer for forming the ground selection line 152 and the second etch stop layer 164, and the portion of the first etch stop layer 162 is removed by using an etching process using an etching selectivity between the first etch stop layer 162 and the second etch stop layer 164, the upper surface of the substrate 100 is not recessed and an undercut may be generated in portions of the first and second etch stop layers 162 and 164 due to an isotropic etching characteristic of the etching process. Also, a portion of the upper surface of the substrate 100 that is not covered by the first etch stop layer 162 may be formed to be flat and the bottom surface of the first channel layer 122 facing the portion of the upper surface of the substrate 100 may be formed to be flat. Also, since a contact area with the substrate 100 may be increased by the protruding region 120b of the first channel layer 122, a contact resistance between the channel structure 120 and the substrate 100 may be reduced.

The gate insulating layer 140 may be formed surrounding the side wall of the second channel layer 124. The bottom surface of the gate insulating layer 140 may be formed on a level that is lower than the bottom surface of the ground selection line 152 and higher than the bottom surface of the second etch stop layer 164. Accordingly, the gate insulating layer 140 does not contact the upper surface of the substrate 100.

Figure 4A:
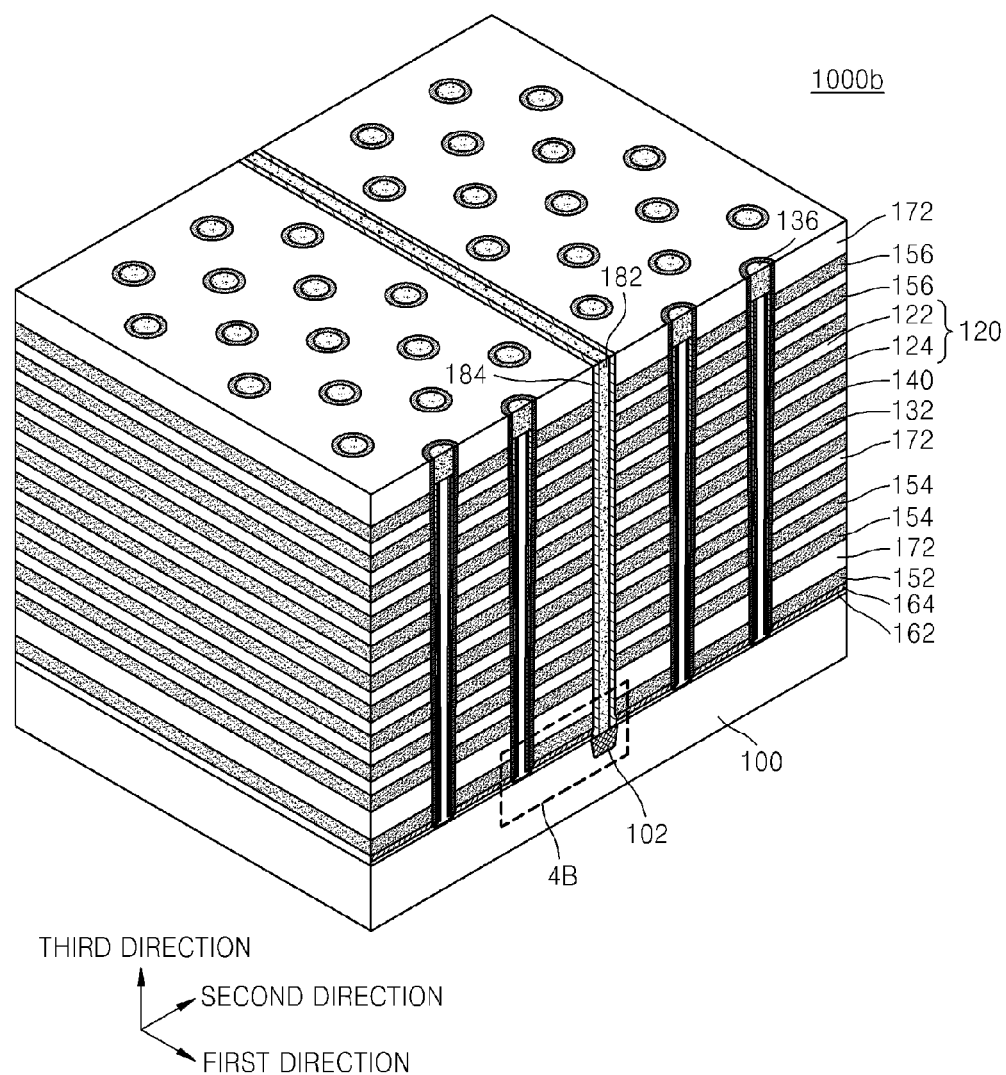
FIG. 4A is a perspective view illustrating a vertical semiconductor device according to another exemplary embodiment.
Figure 4B:
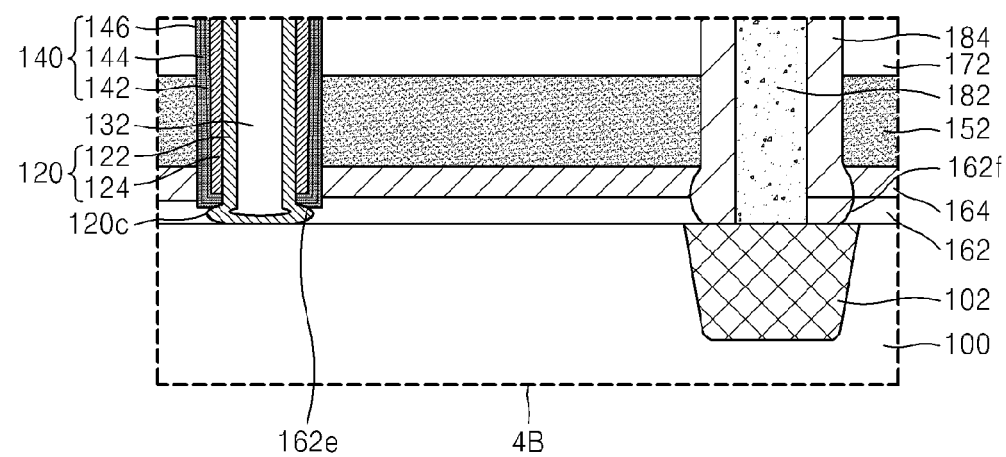
FIG. 4B is an enlarged cross-sectional view illustrating a portion 4B of FIG. 4A, according to one exemplary embodiment.

FIG. 4A is a perspective view illustrating a vertical semiconductor device 1000b according to another exemplary embodiment. FIG. 4B is an enlarged cross-sectional view illustrating a portion 4B of FIG. 4A, according to one exemplary embodiment. Since the vertical semiconductor device 1000b of FIGS. 4A and 4B is similar to the vertical semiconductor device 1000a described with reference to FIGS. 3A and 3B, except for the shape of the channel structure 120 and gate insulating layer 140, the following description will mainly discuss the above-described differences.

Referring to FIGS. 4A and 4B, a first undercut region 162e may be formed in the portion of the first etch stop layer 162 adjacent to the channel structure 120. For example, the side wall of the first etch stop layer 162 may be recessed in the lateral direction and thus the first undercut region 162e may be formed.

In one embodiment, a protruding region 120c of the channel structure 120 may be formed on the side wall portion of the first channel layer 122 that is overlapped with the first etch stop layer 162 in the horizontal direction. Therefore, the protruding region 120c of the first channel layer 122 may be located in the first undercut region 162e, also described as a concave region of the first etch stop layer 162. Also, the bottom surface of the gate insulating layer 140 surrounding the side wall of the channel structure 120 may be located on a level that is lower than the upper surface of the first etch stop layer 162. Also, the bottom surface of the gate insulating layer 140 may not contact the upper surface of the substrate 100, and may be higher than a lower surface of the first etch stop layer 162.

FIGS. 5A through 5J are cross-sectional views illustrating a method of manufacturing the vertical semiconductor device 1000 according to an exemplary embodiment. FIGS. 5A through 5J are cross-sectional views obtained by viewing the perspective view of FIG. 2A from the first direction according to a process order. The method described with reference to FIGS. 5A through 5J depicts an exemplary method of manufacturing the vertical semiconductor device 1000 described with respect to FIGS. 2A and 2B.

Referring to FIG. 5A, the first etch stop layer 162 is formed on the substrate 100 and a first sacrificial layer 192 is formed on the first etch stop layer 162. The first insulating layers 172 and a plurality of second sacrificial layers 194 are alternately stacked on the first sacrificial layer 192. The first insulating layers 172 and the third sacrificial layers 196 are alternately stacked on the second sacrificial layer 194, for example, at the top portion of the structure shown in FIG. 5A.

In exemplary embodiments, the first etch stop layer 162 is formed by using an insulating material such as a silicon oxide, a silicon nitride, or a silicon oxynitride. However, the material of the first etch stop layer 162 is not limited thereto and may include any material having an etching selectivity with respect to the first sacrificial layer 192 and/or the substrate 100. Also, the first insulating layers 172 may be formed by using an insulating material such as a silicon oxide, a silicon nitride, or a silicon oxynitride. In exemplary embodiments, the first to third sacrificial layers 192, 194, and 196 may be formed by using a conductive material such as polysilicon doped with impurities.

The number of the second sacrificial layers 194 and/or the third sacrificial layers 196 may vary according to the number of the word lines 154 of FIG. 5J and the string selection lines 156 of FIG. 5J formed in the subsequent process. Also, although FIG. 5A illustrates that only one first sacrificial layer 192 is formed, when the number of the ground selection lines 152 of FIG. 5J is two or more, two or more first sacrificial layers 192 may be stacked. The thickness and/or interval of the first to third sacrificial layers 192, 194, and 196 may be formed to be different from one another. In exemplary embodiments, as the thickness of the first insulating layer 172 that is stacked between the first sacrificial layer 192 and the lowermost one of the second sacrificial layers 194 is adjusted (e.g., to be thicker than other first insulating layers 172), the interval in the vertical direction between the ground selection line 152 and the word lines 154 formed in the subsequent process are also adjusted.

Next, a first opening T1 may be formed to penetrate the first insulating layers 172 and the second and third sacrificial layers 194 and 196. In exemplary embodiments, a mask pattern (not shown) is formed on the first insulating layer 172, and the first insulating layers 172 and the second and third sacrificial layers 194 and 196 are anisotropically etched until the upper surface of the first sacrificial layer 192 is exposed by using the mask pattern as an etch mask.

Referring to FIG. 5B, a portion of the first sacrificial layer 192 exposed to a bottom portion of the first opening T1 is removed. In exemplary embodiments, when the first sacrificial layer 192 includes polysilicon and the first etch stop layer 162 includes a silicon oxide, the first sacrificial layer 192 only is selectively etched by using an etchant that selectively etches polysilicon only so that an upper surface of the first etch top layer 162 becomes exposed. The etching process may be, for example, a wet etching process or a dry etching process.

Next, a portion of the first etch stop layer 162 exposed to the bottom portion of the first opening T1 may be removed. In exemplary embodiments, when the first etch stop layer 162 includes a silicon oxide and the substrate 100 includes silicon, the first etch stop layer 162 only is selectively etched by using an etchant that selectively etches silicon oxide only so that an upper surface of the substrate 100 may be exposed. The etching process may be, for example, a wet etching process or a dry etching process.

For example, the etching process of removing the first etch stop layer 162 may have an isotropic etch characteristic. For example, as the first etch stop layer 162 is removed in the third direction perpendicular to the substrate 100, a predetermined amount of the first etch stop layer 162 may be removed in the first and second directions horizontal to the substrate 100. Accordingly, the first undercut region 162a may be formed by etching of the first etch stop layer 162 in the lateral direction in the bottom portion of the first opening T1. For example, the first etch stop layer 162 is recessed in the lateral direction in the bottom portion of the first opening T1 and thus the width of a portion of the first opening T1 located on the same level as the first etch stop layer 162 may be larger than the width of a portion of the first opening T1 located on the same level as the first sacrificial layer 192 and/or the first insulating layer 172.

Since the upper surface of the substrate 100 is hardly etched in the etching process of removing the first etch stop layer 162, a portion of the upper surface of the substrate 100 exposed to the bottom portion of the first opening T1 may have a flat shape without being recessed.

In exemplary embodiments, the etching process of removing the first sacrificial layer 192 and the etching process of removing the first etch stop layer 162 may be performed as a separate process or may be performed in an in-situ process.

The first opening T1 may be, for example, a channel hole for forming the channel structure 120 of FIG. 5J in the subsequent process. Since the bottom portion of the first opening T1 may extend in the lateral direction, a contact resistance between the substrate 100 and the channel structure 120 to be formed in the first opening T1 in the subsequent process may be reduced. Also, since the substrate 100 has no recess in the bottom portion of the first opening T1, the decrease in the cell current and the distribution of cell current caused by the recess of the substrate 100 may be prevented.

Referring to FIG. 5C, the gate insulating layer 140 is formed on the side wall and the bottom portion of the opening T1. The gate insulating layer 140 may be conformally formed in the first undercut region 162a at the side wall and the bottom portion of the first opening T1 with a predetermined thickness. In one embodiment, the first opening T1 is not completely filled.

In exemplary embodiments, the gate insulating layer 140 includes the tunnel insulating layer 142 of FIG. 2B, the charge retaining layer 144 of FIG. 2B, and the blocking insulating layer 146 of FIG. 2B which are sequentially stacked (e.g., sequentially conformally formed). In exemplary embodiments, the tunnel insulating layer 142, the charge retaining layer 144, and the blocking insulating layer 146 may be formed by using an atomic layer deposition (ALD) process, a chemical vapor deposition (CVD) process, etc. For example, the tunnel insulating layer 142 may be formed by using a silicon oxide. The charge retaining layer 144 may be formed by using a silicon nitride or polysilicon, or may include a quantum dot or nano crystal. The blocking insulating layer 146 may include a high dielectric constant material. For example, the blocking insulating layer 146 may include a hafnium oxide, a zirconium oxide, an aluminum oxide, a tantalum oxide, an yttrium oxide, or combinations thereof.

Although it is not illustrated in the drawings, a barrier material layer may be further formed on the side wall of the first opening T1 before the gate insulating layer 140 is formed. The barrier material layer may have a function to prevent direct contact between the gate insulating layer 140 and the first to third sacrificial layers 192, 194, 196. For example, the barrier material layer may be formed by using a titanium nitride, a tungsten nitride, and a tantalum nitride.

Referring to FIG. 5D, the second channel layer 124 is formed on the gate insulating layer 140 in the first opening T1. The second channel layer 124 may be formed on the side wall of the first opening T1 with a predetermined thickness.

In exemplary embodiments, a conductive layer (not shown) is conformally formed on the side wall and the bottom portion of the first opening T1. An anisotropic etching process is then performed on the conductive layer so that a portion of the conductive layer formed on the bottom portion of the first opening T1 may be removed, thereby forming the second channel layer 124.

Next, a portion of the gate insulating layer 140 exposed to the bottom portion of the first opening T1 is also removed so that the upper surface of the substrate 100 is exposed. The process of removing the gate insulating layer 140 may be an etching process using an etching selectivity of the gate insulating layer 140 with respect to the substrate 100. Accordingly, the upper surface of the substrate 100 exposed to the bottom portion of the first opening T1 may have a flat shape without being recessed.

In exemplary embodiments, the second channel layer 124 may be formed by using a conductive material such as polysilicon doped with impurities. For example, the impurities may be p-type impurities such as phosphorus (P) or arsenic (As) or n-type impurities such as boron (B). In one embodiment, the impurities are in-situ doped in the process of forming the second channel layer 124. Alternatively, the impurities may be injected into the second channel layer 124 by using an ion-implantation process after the second channel layer 124 is formed.

Referring to FIG. 5E, the first channel layer 122 is formed on the second channel layer 124 in the first opening T1 of FIG. 5D and the upper surface of the substrate 100. In one embodiment, the first channel layer 122 is conformally formed on the side wall of the second channel layer 124 (e.g., an inner sidewall) with a predetermined thickness so that the first opening T1 not completely filled.

In exemplary embodiments, the first channel layer 122 may be formed by using a conductive material such as polysilicon doped with impurities. The first channel layer 122 may be formed by using the same material as the second channel layer 124. However, the material for the first channel layer 122 is not limited thereto. Also, an impurity doping concentration of the first channel layer 122 may be the same as or different from that of the second channel layer 124.

The stack structure of the second channel layer 124 and the first channel layer 122 may form and define the channel structure 120. For example, the channel structure 120 may include the first channel layer 122 contacting the substrate 100 and extending in the vertical direction and the second channel layer 124 surrounding an outer wall of the first channel layer 122.

Since the gate insulating layer 140 and the second channel layer 124 are conformally formed in the first undercut region 162a of the first etch stop layer 162, the bottom portion of the second channel layer 124 protrudes in the lateral direction so that the protruding region 120a may be formed.

Next, the gap-fill insulating layer 132 may be formed on the first channel layer 122 in the first opening T1. In exemplary embodiments, an insulating layer (not shown) filling the first opening T1 is formed and the gap-fill insulating layer 132 may be formed by performing a chemical mechanical polishing (CMP) process and/or an etch-back process. The upper surface of the gap-fill insulating layer 132 is formed on a level lower than the upper surface of the uppermost one of the first insulating layers 172 so that a portion of the upper portion of the first opening T1 is not filled. The upper surface of the gap-fill insulating layer 132 may be formed on a level higher than the upper surface of the third sacrificial layer 196.

In the etch-back process for forming the gap-fill insulating layer 132, the portions of the first channel layer 122 and/or the second channel layer 124 formed in the uppermost portion of the side wall of the first opening T1 may be removed. Accordingly, the upper surfaces of the first channel layer 122 and/or the second channel layer 124 may be located on the same level as the upper surface of the gap-fill insulating layer 132.

Next, the first conductive layer 136 filling the first opening T1 is formed on the first and second channel layers 122 and 124 and the gap-fill insulating layer 132. For example, in one embodiment, after a conductive material (not shown) is formed on the first and second channel layers 122 and 124, the gap-fill insulating layer 132, and the first insulating layer 172, an upper portion of the conductive material layer is planarized until the upper surface of the first insulating layer 172 is exposed and thus the first conductive layer 136 is formed. The first conductive layer 136 may be formed by using a conductive material such as polysilicon doped with impurities, for example.

Referring to FIG. 5F, the second insulating layer 174 is formed on the first insulating layer 172 and the first conductive layer 136. The second insulating layer 174 may be formed by using, for example, a silicon oxide, a silicon nitride, or a silicon oxynitride. The second insulation layer 174 may function as a polishing stop layer in a CMP process of forming the common source line 182 of FIG. 5J. Although FIG. 5F illustrates that the second insulating layer 174 is formed to be a single layer, the second insulating layer 174 may also be formed in a stack structure of two materials having different etching selectivities.

Next, a second opening T2 for exposing the upper surface of the first sacrificial layer 192 is formed by anisotropically etching the first and second insulating layers 172 and 174 and the second and third sacrificial layers 194 and 196 between the neighboring channel structures 120. The second opening T2 may extend in the first direction. Also, the first and second insulating layers 172 and 174, the upper surface of the first sacrificial layer 192, and the side surfaces of the second and third sacrificial layers 194 and 196 may be exposed as the second opening T2 is formed.

In one embodiment, the first sacrificial layer 192 is etched by a predetermined thickness, but the second opening T2 does not completely penetrate the first sacrificial layer 192. Accordingly, the upper surface of the first etch stop layer 162 is not exposed by the second opening T2.

Referring FIG. 5G, a silicidation process is performed on the first to third sacrificial layers 192, 194, and 196 of FIG. 5F exposed by the second opening T2 so that the first sacrificial layer 192 may be converted to the ground selection line 152, the second sacrificial layers 194 to the word lines 154, and the third sacrificial layers 196 to the string selection lines 156.

In exemplary embodiments, the ground selection line 152, the word lines 154, and the string selection lines 156 may include titanium silicide, tantalum silicide, tungsten silicide, cobalt silicide, or nickel silicide.

In an exemplary process of forming the ground selection line 152, the word lines 154, and the string selection lines 156, after a metal material (not shown) filling the second open gin T2 is formed, the substrate 100 may be annealed at a temperature of about 200° C. to about 600° C. for about 1 to about 10 hours. However, the silicidation process is not limited thereto.

According to one embodiment, since the second opening T2 does not completely penetrate the first sacrificial layer 192, the first etch stop layer 162 under the bottom portion of the second opening T2 and the upper surface of the substrate 100 are not exposed in the silicidation process. Accordingly, the upper portion of the substrate 100 is prevented from being converted into an undesirable metal silicide as the upper portion of the substrate 100 reacts together in the silicidation process. Accordingly, the silicidation process may be maintained in sufficient time for completely converting the first to third sacrificial layers 192, 194, and 196 into metal silicide materials while preventing undesirable silicidation of the substrate 100 from occurring. Accordingly, to form the ground selection line 152, the word lines 154, and the string selection lines 156, a method of completely converting the first to third sacrificial layers 192, 194, and 196 into metal silicide materials may be employed instead of a method of removing the first to third sacrificial layers 192, 194, and 196 and filling the removed portions with conductive materials. As a result, the process of forming the ground selection line 152, the word lines 154, and the string selection lines 156 may be simplified. Also, the heights of the first to third sacrificial layers 192, 194, and 196 may be reduced in the vertical direction and thus the process of forming the channel hole may be made easy and a cell current may be increased.

Referring to FIG. 5H, a portion of the ground selection line 152 and a portion of the first etch stop layer 162 exposed to the bottom portion of the second opening T2 are removed. In exemplary embodiments, the process of removing the ground selection line 152 may be an anisotropic etching process, or a wet etching process or a dry etching process using an etchant having an etching selectivity with respect to the first etch stop layer 162.

In exemplary embodiments, the process of removing the portion of the first etch stop layer 162 may be a wet etching process or a dry etching process using an etchant having an etching selectivity with respect to the substrate 100. When the portion of the first etch stop layer 162 is removed by the isotropic etching characteristic of the etching process, the second undercut region 162b may be formed in the portion of the first etch stop layer 162. For example, the bottom portion of the second opening T2 that is overlapped with the first etch stop layer 162 in the horizontal direction may extend in the lateral direction. Also, the upper surface of the substrate 100 that is exposed may have a flat shape without being recessed in the process of removing the portion of the first etch stop layer 162.

Next, the source region 102 is formed in the upper portion of the substrate 100, for example, by injecting impurities into the upper portion of the substrate 100 that is exposed by the second opening T2. The impurities may be n-type impurities such as such as phosphorus (P) or arsenic (As), or p-type impurities such as boron (Br).

As described above, since the upper surface of the substrate 100 where the source region 102 is formed is not exposed during the silicidation process, the source region 102 is prevented from including a metal silicide material.

Referring to FIG. 5I, after an insulating layer (not shown) having a predetermined thickness is formed on the upper surface of the second insulating layer 174 and the inner wall of the second opening T2, an anisotropic etching process is performed on the insulating layer until the upper surface of the substrate 100 in the bottom portion of the second opening T2 is exposed so that the spacer 184 for covering the side walls of the second opening T2 is formed. The upper surface of the second insulating layer 174 may also be exposed by the anisotropic etching process. In exemplary embodiments, the spacer 184 may be formed by using an insulating material such as a silicon nitride, a silicon oxide, or a silicon oxynitride.

Next, the common source line 182 filling the second opening T2 may be formed on the side wall of the spacer 184. The common source line 182 is electrically connected to the source region 102 of the substrate 100 and extends in the first direction.

In an exemplary process, a conductive material layer (not shown) may be formed on the upper surface of the second insulating layer 174 and on the inner wall of the second opening T2 and, the upper portion of the conductive material layer may be planarized until the upper surface of the second insulating layer 174 is exposed to form the common source line 182. For example, the common source line 182 may be formed of metal, polysilicon, metal silicide, or combinations thereof. For example, the common source line 182 may be formed by using metal such as tungsten (W), aluminum (Al), copper (Cu), titanium (Ti), or tantalum (Ta), polysilicon doped with impurities, or metal silicide such as nickel silicide, titanium silicide, tungsten silicide, or cobalt silicide.

Referring to FIG. 5J, the second insulating layer 174 of FIG. 5I is removed and the upper surfaces of the first insulating layer 172 and the first conductive layer 136 are exposed. In an exemplary process, the second insulating layer 174 may be removed by performing a planarization process on the upper portion of the second insulating layer 174 until the upper surface of the first conductive layer 136 is exposed. In the planarization process, the portions of the common source line 182 and the spacer 184 located on the same level as the second insulating layer 174 are also removed.

Next, the third insulating layer 176 is formed on the first conductive layer 136, the first insulating layer 172, and the common source line 182, and the bit line contacts 212 penetrating the third insulating layer 176 and electrically connected to the first conductive layer 136 are formed.

Next, the bit line 214 connecting the bit line contacts 212 arranged in the second direction is formed on the third insulating layer 176. The bit line 214 may be formed, for example, in the shape of a line extending in the second direction.

In one embodiment, the vertical semiconductor device 1000 is thus prepared by performing the above-described processes.

According to the above exemplary method of manufacturing the vertical semiconductor device 1000, in the process of forming the first opening T1 for forming the channel structure 120, an etching process is performed by using an etching selectivity of the first etch stop layer 162 with respect to the substrate 100 and thus the upper surface of the substrate 100 that is exposed to the bottom portion of the first opening T1 is formed in a flat shape without being recessed and the first opening T1 may extend in the lateral direction. Accordingly, the decrease in the cell current or the distribution of cell current caused by the formation of a recess of the substrate 100 may be prevented. Also, the contact resistance between the substrate 100 and the channel structure 120 may be reduced and the electrical characteristic of the vertical semiconductor device 1000 may be improved.

Also, an undesirable silicide reaction of the substrate 100 may be prevented. As the ground selection line 152, the word lines 154, and/or the string selection lines 156 are formed by performing a silicidation process on the first to third sacrificial layers 192, 194, and 196, the manufacturing process of the vertical semiconductor device 1000 may be simplified.

FIGS. 6A through 6F are cross-sectional views illustrating a method of manufacturing the vertical semiconductor device 1000a of FIGS. 3A and 3B according to another exemplary embodiment. Since the manufacturing method is similar to the above-described method of manufacturing the vertical semiconductor device 1000 described with reference to FIGS. 5A through 5J, except for a few steps, the following description will mainly discuss differences therebetween. In FIGS. 3A, 3B, and 6A through 6F, like reference numerals denote like constituent elements.

Figure 6A:
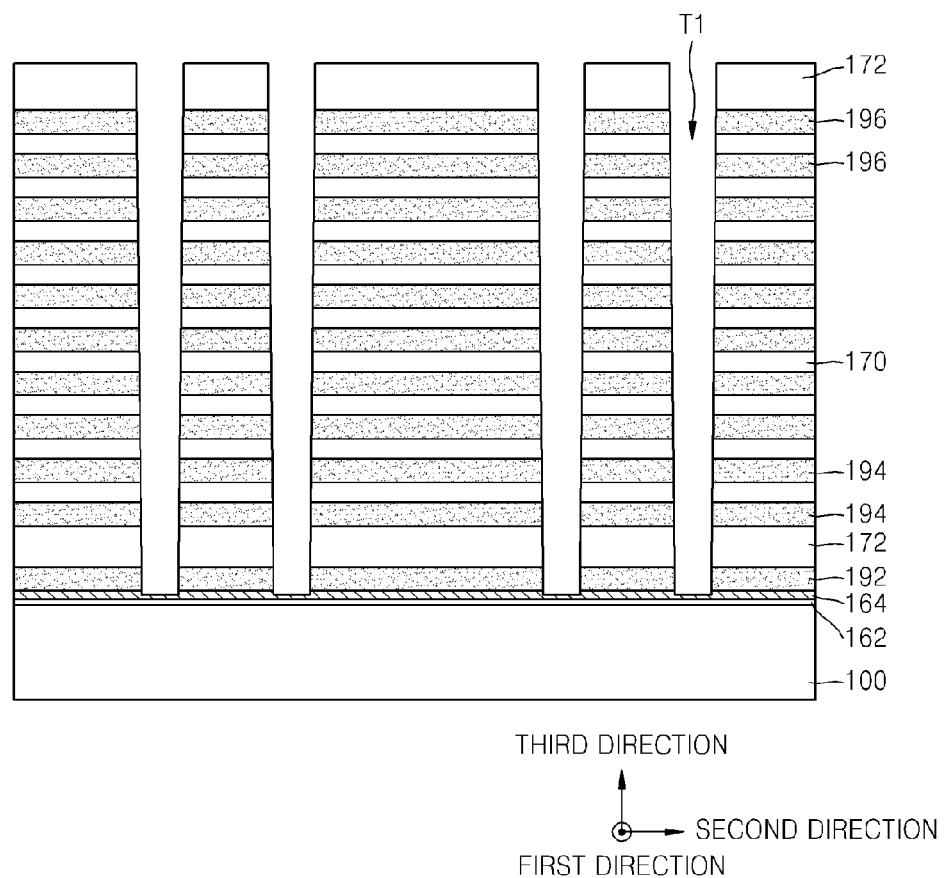
FIGS. 6A through 6F are cross-sectional views illustrating a method of manufacturing a vertical semiconductor device according to another exemplary embodiment.

Referring to FIG. 6A, the first etch stop layer 162, the second etch stop layer 164, and the first sacrificial layer 192 are sequentially formed on the substrate 100. The second etch stop layer 164 may include an insulating material, for example, having an etch selectivity with respect to the first sacrificial layer 192 and/or the first etch stop layer 162. For example, the second etch stop layer 164 may be formed by using a silicon oxide, a silicon nitride, a silicon oxynitride, a silicon carbide, or a metal oxide such as a hafnium oxide, an aluminum oxide, a zirconium oxide, a boron oxide, or a tantalum oxide. In an exemplary case, when the first sacrificial layer 192 includes polysilicon and the first etch stop layer 162 includes a silicon oxide, the second etch stop layer 164 may include an aluminum oxide $AlO_x$.

Next, the first opening T1 is formed, for example, by anisotropically etching the first insulating layer 172 and the first to third sacrificial layers 192, 194, and 196 until the upper surface of the second etch stop layer 164 is exposed. In particular, the second etch stop layer 164 may be formed of a material having an etching selectivity with respect to a dry etching process. In this case, it is possible to prevent depth variation in the first opening T1 according to positions on the entire substrate 100 from being generated, and to prevent a recess in the substrate 100 due to over-etching in the etching process for forming the first opening T1 from being produced.

Figure 6B:
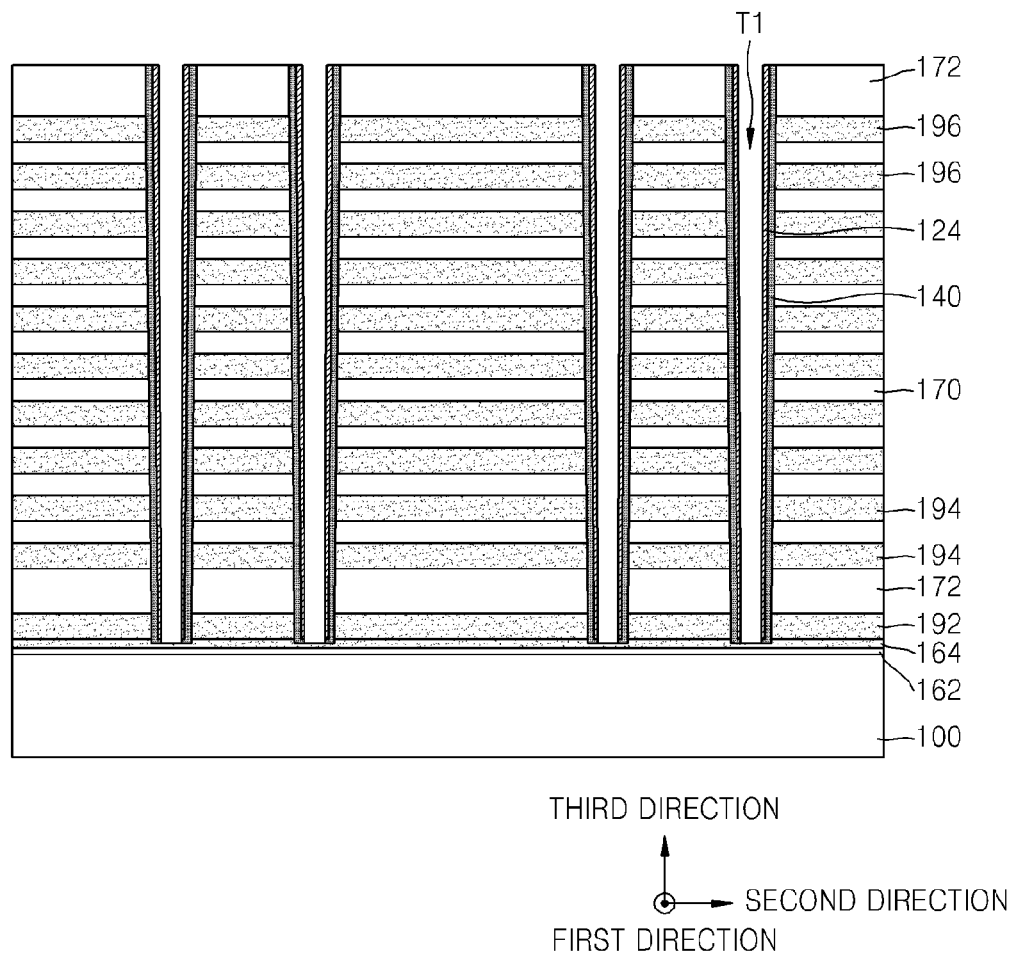

Referring to FIG. 6B, the gate insulating layer 140 and the second channel layer 124 may be formed on the inner walls of the first opening T1.

Next, the portion of the second channel layer 124 formed on the bottom portion of the first opening T1 is removed, for example, by performing an anisotropic etching process on the second channel layer 124, so that the portion of the second channel layer 124 remains only on the inner side walls of the first opening T1. A portion of the second channel layer 124 formed above the first insulating layer 172 may also be removed.

Next, the portion of the gate insulating layer 140 exposed to the bottom portion of the first opening T1 is removed, for example, by performing an anisotropic etching process by using the portion of the second channel layer 124 on the side wall of the first opening T1 as a spacer. A portion of the gate insulating layer 140 formed on the first insulating layer 172 may also be removed. In one embodiment, the upper surface of the second etch stop layer 164 is exposed to the bottom portion of the first opening T1.

In this case, the anisotropic etching of the gate insulating layer 140 may be performed on the second etch stop layer 164. When the gate insulating layer 140 contacts the upper surface of the substrate 100 and the gate insulating layer 140 is anisotropically etched, a recess may be formed in the upper portion of the substrate 100 by over-etching of the gate insulating layer 140. Alternatively, when the gate insulating layer 140 is insufficiently etched, the contact area between the substrate 100 and the channel structure 120 may be reduced or the electrical connection between the channel structure 120 and the substrate 100 may not be established. According to the disclosed embodiments, since the gate insulating layer 140 is anisotropically etched on the etch stop layer 164, the portion of the gate insulating layer 140 formed in the bottom portion of the first opening T1 may be completely removed. Accordingly, the contact resistance between the channel structure 120 and the substrate 100 can be reduced and a cell current can be increased.

Unlike the process described with reference to FIGS. 6A and 6B, after the upper surface of the first etch stop layer 162 is exposed by further removing the second etch stop layer 164 in the process of forming the first opening T1, the first gate insulating layer 140 and the second channel layer 124 may be formed on the inner walls of the first opening T1 and on the exposed upper surface of the first etch stop layer 162.

In this case, the vertical semiconductor device 1000b described with reference to FIGS. 4A and 4B may be formed.

Figure 6C:
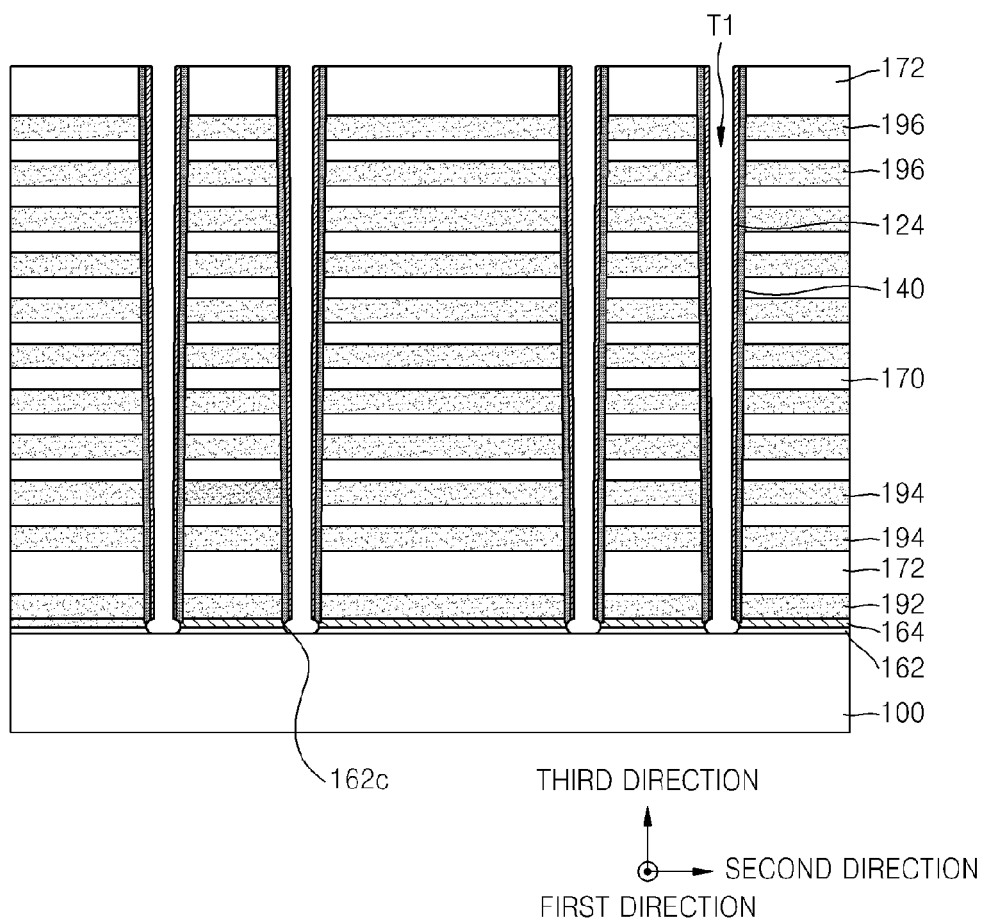

Referring to FIG. 6C, the portions of the first etch stop layer 162 and the second etch stop layer 164 exposed to the bottom portion of the first opening T1 may be sequentially removed. For example, the process of removing the portion of the second etch stop layer 164 may be performed by a wet etching process or a dry etching process using an etchant having an etching selectivity with respect to the first etch stop layer 162. For example, when the second etch stop layer 164 includes an aluminum oxide $AlO_x$ and the first etch stop layer 162 includes a silicon oxide, a wet etching process using an etchant including $H_3PO_4$ may be performed. Also, the process of removing the portion of the first etch stop layer 162 may be performed by a wet etching process or a dry etching process using an etchant having an etching selectivity with respect to the substrate 100.

Due to the isotropic etching characteristic of the etching process of removing the first and second etch stop layers 162 and 164, the portions of the first etch stop layer 162 and/or the second etch stop layer 164 are recessed in the lateral direction and thus the first undercut region 162c may be formed. Accordingly, the bottom portion of the first opening T1 extends in the lateral direction and the size of the upper surface of the substrate 100 exposed to the bottom portion of the first opening T1 may be increased.

The portion of the gate insulating layer 140 exposed to the bottom portion of the first opening T1 may be etched by a predetermined amount in the etching process to remove the first and second etch stop layers 162 and 164. Accordingly, the portion of the gate insulating layer 140 formed in the lower portion of the second channel layer 124 is etched in the lateral direction so that the bottom portion of the first opening T1 may further extend in the lateral direction. On the other hand, since the portion of the second channel layer 124 is hardly etched in the etching process, the first undercut region 162c may be formed from the same level as the bottom surface of the second channel layer 124 to the same level as the upper surface of the substrate 100.

Figure 6D:
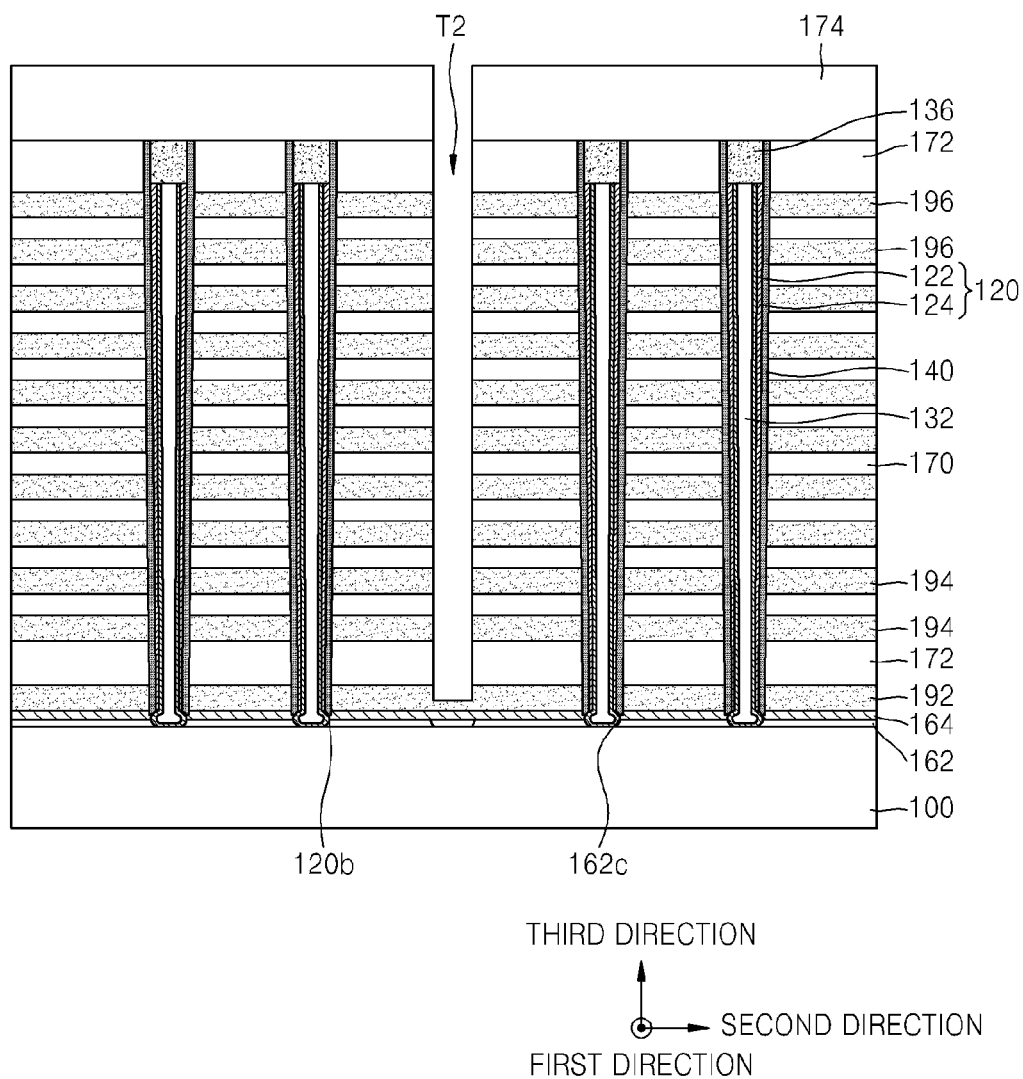

Referring to FIG. 6D, the first channel layer 122 is formed on the inner wall of the first opening T1. The bottom portion of the first channel layer 122 contacts the upper surface of the substrate 100 and may be formed in the first undercut region 162c of the first etch stop layer 162 and/or the second etch stop layer 164. Accordingly, the protruding region 120b protruding in the lateral direction may be formed on the portion of the side wall of the first channel layer 122 that is overlapped with the first and second etch stop layers 162 and 164.

Figure 6E:
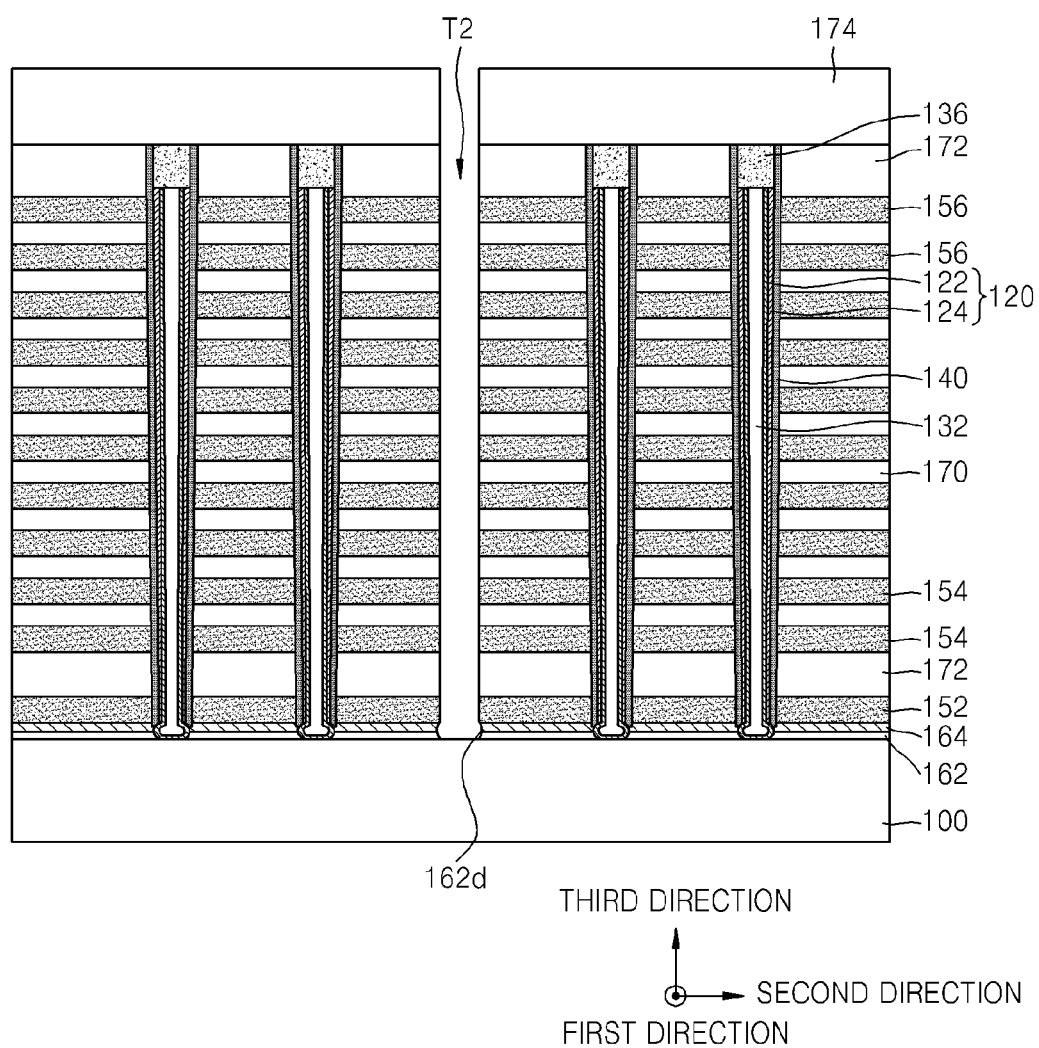

Referring to FIG. 6E, the portions of the first and second etch stop layers 162 and 164 exposed to the bottom portion of the opening T2 may be sequentially removed. As described above, the etching processes to remove the portions of the first and second etch stop layers 162 and 164 may be performed by using etchants having etching selectivities with respect to the substrate 100 and the first etch stop layer 162, respectively. As the portions of the first etch stop layer 162 and/or the second etch stop layer 164 are recessed in the lateral direction, the second undercut region 162d may be formed.

Figure 6F:
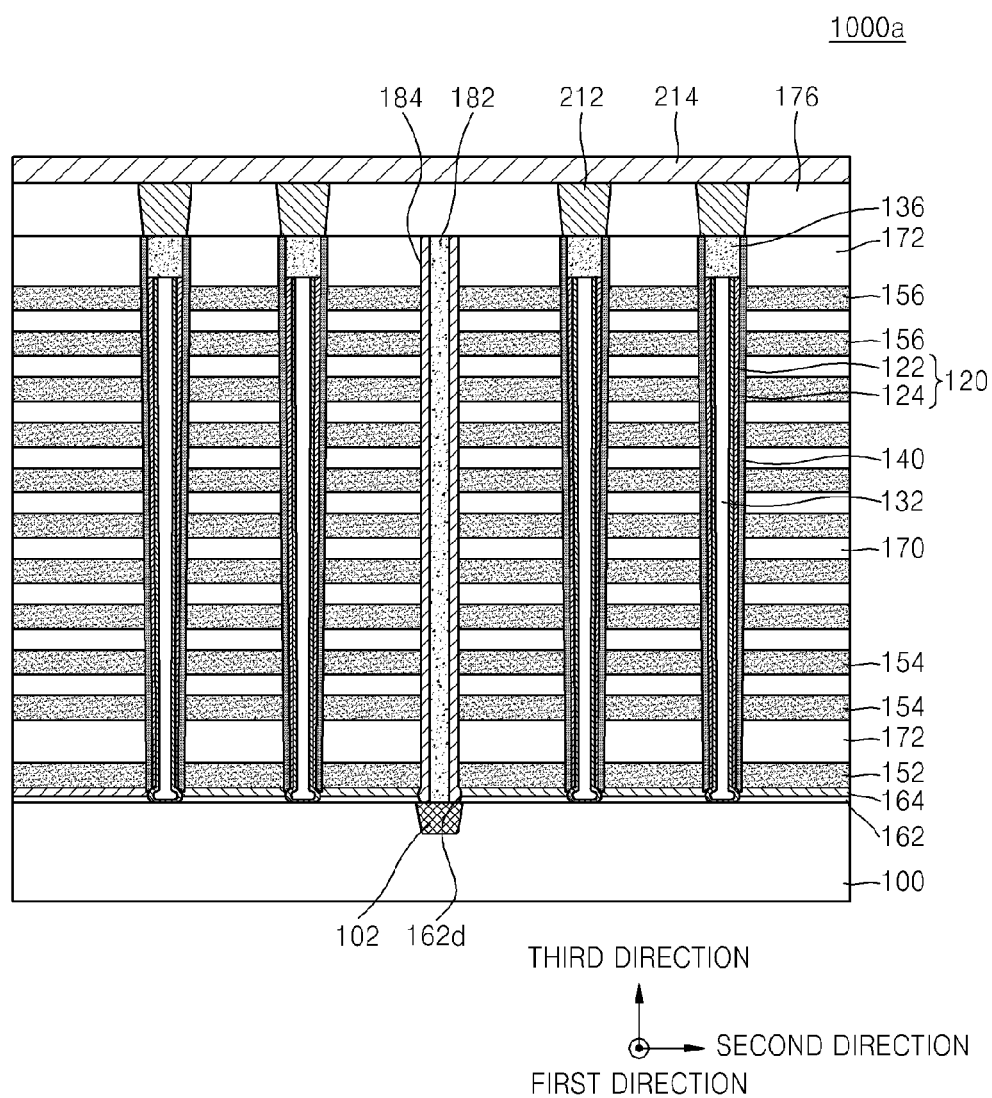

Next, the processes described above with reference to FIGS. 4H through 4J are performed so that the vertical semiconductor device 1000a of FIG. 6F is provided.

According to the method of manufacturing the vertical semiconductor device 1000a, the second etch stop layer 164 is further formed so that the formation of a recess in the upper portion of the substrate 100 due to over-etching of the first opening T1 may be prevented. Also, since the portion of the gate insulating layer 140 in the bottom portion of the first opening T1 is sufficiently etched in the upper portion of the second etch stop layer 164, the contact resistance between the substrate 100 and the channel structure 120 may be reduced and the electrical characteristic of the vertical semiconductor device 1000a may be improved.

Figure 7:
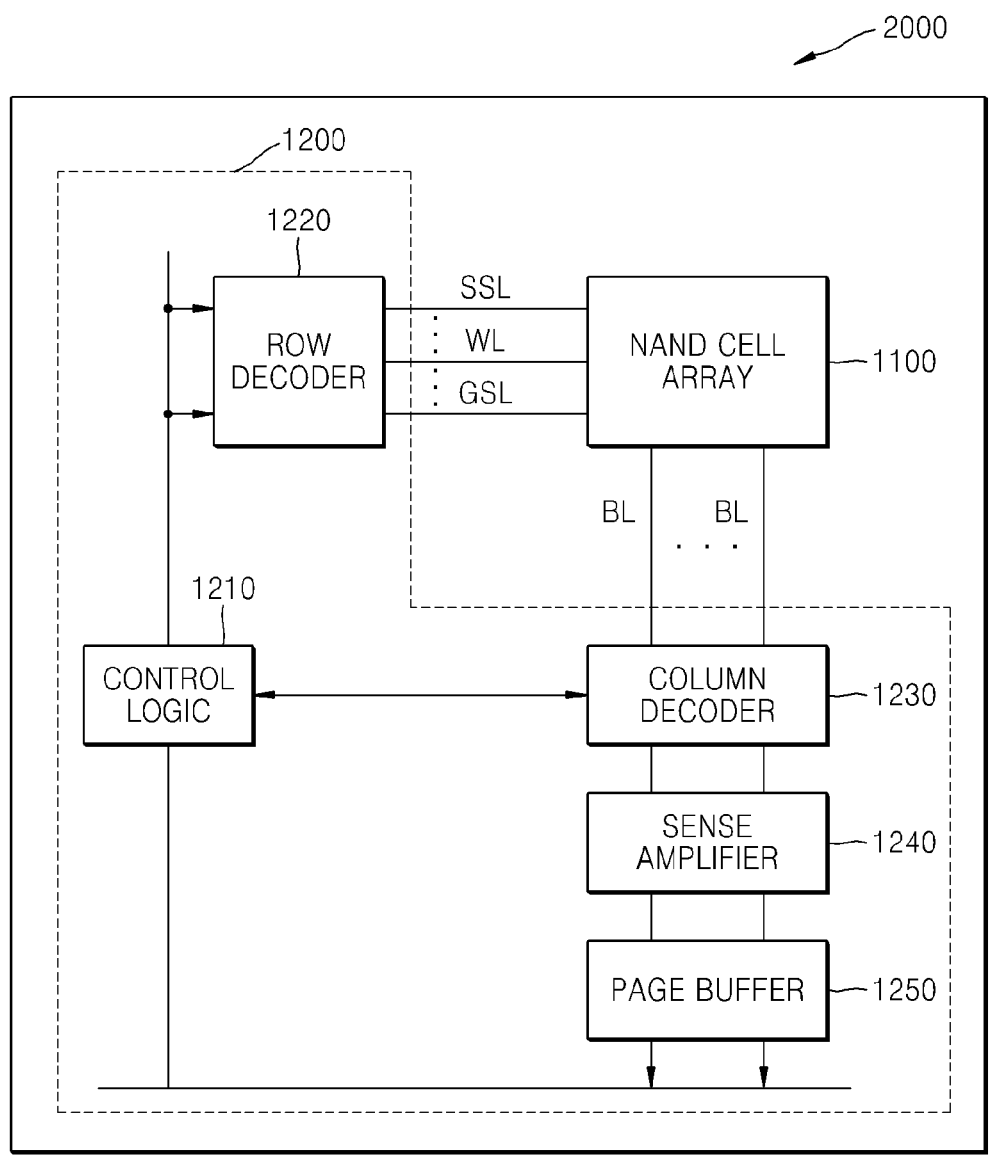
FIG. 7 is a block diagram schematically illustrating a non-volatile memory device according to one exemplary embodiment.

FIG. 7 is a block diagram schematically illustrating a non-volatile memory device 2000 according to an exemplary embodiment. Referring to FIG. 7, in the non-volatile memory device 2000, a NAND cell array 1100 may be combined with a core circuit unit 1200. For example, the NAND cell array 1100 may include the vertical semiconductor devices 1000, 1000a, and 1000b that are described above with reference to FIGS. 2A through 4B. The core circuit unit 1200 may include a control logic 1210, a row decoder 1220, a column decoder 1230, a sense amplifier 1240, and a page buffer 1250.

The control logic 1210 may communicate with the column decoder 1230, the sense amplifier 1240, and the page buffer 1250. The row decoder 1220 may communicate with the NAND cell array 1100 via a plurality of string selection lines SSL, a plurality of word lines WL, and a plurality of ground selection lines GSL. The column decoder 1230 may communicate with the NAND cell array 1100 via a plurality of bit lines BL. The sense amplifier 1240 may be connected to the column decoder 1230 when a signal is output from the NAND cell array 1100 outputs a signal, and may be disconnected from the column decoder 130 when a signal is transferred to the NAND cell array 1100.

For example, in certain embodiments, the control logic 1210 transfers a row address signal to the row decoder 1220. The row decoder 1220 may decode the row address signal and transfer the row address signal to the NAND cell array 1100 via the string selection lines SSL, the word lines WL, and the ground selection lines GSL. The control logic 1210 may transfer a column address signal to the column decoder 1230 or the page buffer 1250. The column decoder 1230 may decode the column address signal and transfer the column address signal to the NAND cell array 1100 via the bit lines BL. The signal of the NAND cell array 1100 may be transferred to the sense amplifier 1240 through the column decoder 1230 and, after being amplified by the sense amplifier 1240, may be transferred to the control logic 1210 through the page buffer 1250.

While the present disclosure has been particularly shown and described with reference to exemplary embodiments thereof, it will be understood that various changes in form and details may be made therein without departing from the spirit and scope of the following claims.

What is claimed is:

1. A vertical semiconductor device, comprising:
a substrate;
a stack of layers including at least a first ground selection line, a plurality of word lines, and at least a first string select line stacked alternately with insulating layers on the substrate;
an additional insulating layer between the substrate and the stack of layers;
a channel structure penetrating the additional insulating layer and the stack of layers and extending vertically in a first direction perpendicular to a top surface of the substrate; and
a gate insulating layer surrounding outer walls of the channel structure, wherein a bottom surface of the channel structure contacts the top surface of the substrate; and
wherein a first width of the channel structure in a horizontal direction at a level of the additional insulating layer is larger than a second width of the channel structure in the horizontal direction at the same level as the ground selection line.

2. The vertical semiconductor device of claim 1, further comprising:
a source region extending in an upper portion of the substrate in a second direction parallel to the top surface of the substrate; and
a common source line electrically connected to the source region,
wherein the source region does not comprise a metal silicide material.

3. The vertical semiconductor device of claim 1, wherein a height of the top surface of the substrate is the same at a location that contacts the bottom surface of the channel structure as at locations that do not contact bottom surfaces of channel structures.

4. The vertical semiconductor device of claim 1, wherein:
the channel structure and gate insulating layer form a protrusion in the additional insulating layer.

5. The vertical semiconductor device of claim 4, wherein a portion of the gate insulating layer contacts the top surface of the substrate.

6. A vertical semiconductor device, comprising:
a channel structure in a first direction perpendicular to an upper surface of a substrate;
a ground selection line, word lines, and a string selection line sequentially formed on a side surface of the channel structure in the first direction to be separated from one another; and
a first etch stop layer formed between the substrate and the ground selection line,
wherein the channel structure comprises a protruding region formed in a side wall portion of the channel structure between the ground selection line and an uppermost surface of the substrate, the protruding region protruding in a horizontal direction perpendicular to the first direction, and
wherein a width of the channel structure in a first portion of the protruding region in the horizontal direction gradually increases and a width of the channel structure in a second portion of the protruding region in the horizontal direction gradually decreases.

7. The vertical semiconductor device of claim 6, further comprising:
a source region extending in an upper portion of the substrate in a second direction parallel to a main surface of the substrate; and
a common source line electrically connected to the source region,
wherein the source region does not comprise a metal silicide material.

8. The vertical semiconductor device of claim 6, further comprising:
a gate insulating layer provided between the channel structure and the ground selection line,
wherein the gate insulating layer extends along an outer wall of the channel structure so that a bottom surface of the gate insulating layer contacts the uppermost surface of the substrate.

9. The vertical semiconductor device of claim 6,
wherein a bottom surface of the channel structure directly contacts the substrate, and wherein a recess is not formed in a portion of the uppermost surface of the substrate that is vertically aligned with and in contact with the bottom surface of the channel structure.

10. The vertical semiconductor device of claim 6, wherein the first etch stop layer is recessed in the horizontal direction to define an undercut region, and
wherein the protruding region of the channel structure is placed in the undercut region.

11. The vertical semiconductor device of claim 6, wherein the first portion of the protruding region is located on a level higher than that of the second portion of the protruding region with respect to the upper surface of the substrate.

12. The vertical semiconductor device of claim 6, wherein the ground selection line, the word lines, and the string selection line comprise a metal silicide material.

13. The vertical semiconductor device of claim 6, wherein a bottom surface of the channel structure is in contact with the uppermost surface of the substrate.

14. The vertical semiconductor device of claim 6, further comprising a second etch stop layer formed between the ground selection line and the first etch stop layer.

* * * * *